United States Patent
Niv et al.

(10) Patent No.: US 10,917,043 B2
(45) Date of Patent: Feb. 9, 2021

(54) NON-TRACKING SOLAR ENERGY COLLECTOR

(71) Applicant: B. G. NEGEV TECHNOLOGIES AND APPLICATIONS LTD., AT BEN-GURION UNIVERSITY, Beer Sheva (IL)

(72) Inventors: Avi Niv, Kfar-Blum (IL); Ido Frenkel, Kfar Bilu (IL)

(73) Assignee: B. G. Negev Technologies and Applications Ltd., at Ben-Gurion University, Beer Sheva (IL)

(*) Notice: Subject to any disclaimer, the term of this patent is extended or adjusted under 35 U.S.C. 154(b) by 107 days.

(21) Appl. No.: 16/332,951

(22) PCT Filed: Sep. 6, 2017

(86) PCT No.: PCT/IL2017/050999
§ 371 (c)(1),
(2) Date: Mar. 13, 2019

(87) PCT Pub. No.: WO2018/055610
PCT Pub. Date: Mar. 29, 2018

(65) Prior Publication Data
US 2019/0360864 A1    Nov. 28, 2019

Related U.S. Application Data

(60) Provisional application No. 62/399,586, filed on Sep. 26, 2016.

(51) Int. Cl.
*G01J 1/56* (2006.01)
*H01L 31/054* (2014.01)
(Continued)

(52) U.S. Cl.
CPC .......... *H02S 40/22* (2014.12); *H01L 31/0543* (2014.12); *H01L 31/0547* (2014.12);
(Continued)

(58) Field of Classification Search
CPC ............ G01J 1/56; H01L 31/054–0549; H02S 40/20; H02S 40/22
See application file for complete search history.

(56) References Cited

U.S. PATENT DOCUMENTS

| 4,411,490 A | 10/1983 | Daniel |
| 6,333,458 B1 | 12/2001 | Forrest et al. |

(Continued)

FOREIGN PATENT DOCUMENTS

| DE | 102007058971 | 6/2009 |
| WO | 2012103289 A1 | 8/2012 |

OTHER PUBLICATIONS

Otani, et al. "Microbubble actuator using photothermal effect." Optomechatronic Systems III. vol. 4902. International Society for Optics and Photonics, 2002.*

(Continued)

*Primary Examiner* — William E McClain
(74) *Attorney, Agent, or Firm* — The Roy Gross Law Firm, LLC; Roy Gross

(57) ABSTRACT

The present application describes embodiments of a non-tracking solar energy collector comprising: (a) at least one solar radiation concentrator for collimating and directing the incident solar radiation rays to at least one focal point along the surface of a reactive reflector; (b) the reactive reflector mounted on top of an external cavity and having at least one transparency zone instantly formed at said at least one focal point of the solar radiation rays, for letting the solar radiation rays enter said external cavity, wherein said transparency zone is constantly moving along the surface of said reactive (Continued)

reflector following the position of said at least one focal point of the solar radiation rays; and (c) the external cavity containing a solar cell and capable of trapping the entered solar radiation rays by inner scattering of said solar radiation rays on the walls of said external cavity, wherein said inner scattering of said solar radiation rays inside said external cavity is preventing solar radiation to escape from said solar cell, thereby minimising solar radiation losses.

13 Claims, 14 Drawing Sheets

(51) Int. Cl.
| | |
|---|---|
| *H02S 40/22* | (2014.01) |
| *F24S 23/30* | (2018.01) |
| *F24S 23/70* | (2018.01) |
| *G01J 1/04* | (2006.01) |
| *G01J 1/42* | (2006.01) |
| *G02B 5/02* | (2006.01) |
| *G02B 19/00* | (2006.01) |

(52) U.S. Cl.
CPC ............... *F24S 23/30* (2018.05); *F24S 23/70* (2018.05); *G01J 1/0411* (2013.01); *G01J 1/56* (2013.01); *G01J 2001/0481* (2013.01); *G01J 2001/4266* (2013.01); *G02B 5/0242* (2013.01); *G02B 19/0042* (2013.01)

(56) References Cited

U.S. PATENT DOCUMENTS

| | | | |
|---|---|---|---|
| 2012/0261558 | A1 | 10/2012 | Forrest et al. |
| 2013/0146121 | A1 | 6/2013 | Caimi et al. |
| 2016/0231274 | A1 | 8/2016 | Tirapu Azpiroz |

OTHER PUBLICATIONS

Marston, "James Clerk Maxwell: Life and science", Journal of Quantitative Spectroscopy & Radiative Transfer, Jul. 2016, pp. 50-65, vol. 178.
Lebedev, "Unttersuchungen uber die Druckkrafte des Lichte", Annalen der Physik, 1901, pp. 433-458, vol. 311, No. 11.
Nichols, "The Pressure Due to Radiation", Astrophysical Journal, vol. 17, 315-349, (1903).
Gordon, "Radiation Forces and Momenta in Dielectric Media" Physical Review A, vol. 8, No. 1, pp. 14-21 (1973).
Nieminen, et al., "Optical tweezers computational toolbox" Journal of Optics A Pure and Applied Optics, Aug. 2007, vol. 9, No. 8, pp. S196-S203.
Ashkin, "Acceleration and Trapping of Particles by Radiation Pressure", Physical Review Letters, Jan. 26, 1970, vol. 24, No. 4, pp. 156-159.
Phillips, "Laser cooling and trapping of neutral atoms" Rev. Mod. Phys., Jul. 1998, vol. 70, pp. 721-741.
Ashkin, et al, "Observation of a single-beam gradient force optical trap for dielectric particles", Optics Letters, vol. 11, No. 5, May 1986, pp. 288-290.
Harada, et al., "Radiation forces on a dielectric sphere in the Rayleigh scattering regime" Optics Communications, (1996), vol. 124, pp. 529-541.
Nieminen, et al., "Numerical modelling of optical trapping", Computer Physics Communications, (2001), vol. 142, pp. 468-471.
Svoboda, et al, "Optical trapping of metallic Rayleigh particles" Optics Letters, Jul. 1, 1994, vol. 19, No. 13, pp. 930-932.
Brzobohatý, et al., "Non-spherical gold nanoparticles trapped in optical tweezers: shape matters", Opt. Express 23, 8179 (2015).
Mansuripur, "Radiation pressure and the linear momentum of light in dispersive dielectric media", Optics Express, vol. 13, No. 6, pp. 2245-2250, 2005.
Moffitt et al., "Recent advances in optical tweezers", Annu. Rev. Biochem. 2008; vol. 77, pp. 205-228.
Mansuripur, "Radiation pressure and the linear momentum of the electromagnetic field", Opt. Express, vol. 12, No. 22, pp. 5375-5401, 2004.
Neuman et al., "Optical trapping", Rev. Sci. Instrum. Sep. 2004, vol. 75, No. 9, pp. 2787-2809.
Miljković, et al., "Optical Forces in Plasmonic Nanoparticle Dimers", The Journal of Physical Chemistry C, Apr. 29, 2010, vol. 114, No. 16, pp. 7472-7479.
Jiang, et al., M. "Active Motion of a Janus Particle by Self-Thermophoresis in a Defocused Laser Beam", Phys. Rev. Lett., Dec. 31, 2010, vol. 105, No. 26, pp. 1-4.
Ilic et al., "Exploiting Optical Asymmetry for Controlled Guiding of Particles with Light", ACS Photonics, 2016, vol. 3, No. 2, pp. 197-202.
Nedev, S. et al. "An Optically Controlled Microscale Elevator Using Plasmonic Janus Particles", ACS Photonics, 2015, vol. 2, No. 4, pp. 491-496.
Lohse, "Bubble puzzles: From fundamentals to applications", 2018 American Physical Society, Jul. 19, 2018, pp. 36-41.
Zou, et al., "Steady State Vapor Bubble in Pool Boiling", Scientific Report 6, Feb. 3, 2016, pp. 1-8.
Van Hoeve, et al., "Microbubble formation and pinch-off scaling exponent in flow-focusing devices", Physics of Fluids, Feb. 2011, vol. 23, No. 9.
Plesset, et al., "The Growth of Vapor Bubbles in Superheated Liquids", Journal of Applied Physics 25, 493-500 (1954).
Prosperitti, A. Prosperetti 1994—Bubble Dynamics—Some things we did not know 10 years ago.pdf. Bubble Dynamics and interface phenomena (1993).
Akhatov, I. et al., "Collapse and rebound of a laser-induced cavitation bubble", Physics of Fluids 13, pp. 2805-2819 (2001).
Zwick, "The Growth and Collapse of Vapor Bubbles", Department of the Navy, Office of Naval Research, Dec. 1954, pp. 1-103.
Brennen, "Cavitation and Bubble Dynamics", (2010), pp. 1-294.
Prosperetti, A. Bubbles. Phys. Fluids 16, Jun. 2004, vol. 16, No. 6, pp. 1852-1865.
Ciccarelli, et al., "Fragmentation mechanisms based on single drop steam explosion experiments using flash X-ray radiography", Nuclear Engineering and Design 146, 1994, pp. 109-132.
Extended European Search Report, European Application No. 17852534, dated Mar. 18, 2020.

* cited by examiner

NON-TRACKING SOLAR ENERGY COLLECTOR

RELATED APPLICATIONS

This application is a National Phase of PCT Patent Application No. PCT/IL2017/050999 having International filing date of Sep. 6, 2017, which claims the benefit of priority of U.S. Provisional Application No. 62/399,586 filed on Sep. 26, 2016. The contents of the above applications are all incorporated by reference as if fully set forth herein in their entirety.

TECHNICAL FIELD

In general, the present application relates to the field of solar energy collection. In particular, the present application relates to a non-tracking solar-energy collector utilizing the discovered phenomenon of light-generated microparticles propulsion.

BACKGROUND

The ability of light to affect motion on micron-sized objects is important in biology, surface science, and physics, specifically used for in-vivo therapeutic, diagnostics, and drug delivery systems. Current approaches in that regard are based on momentum transfer between light and solid objects or on thermophoresis effects in asymmetric particles, both of which are limited to forces not exceeding few pico-Newton. It is clear therefore that if larger forces are needed, a new approach should be devised.

Recently the mechanical manipulation of micro- and nano-scaled objects gained a particular interest as a possible means for in-vivo therapeutics, drug delivery and diagnostics. Light, in that regard, has a particular appeal as a possible power source due to its inherent ability to peer into the micro and even to the nano scales by the tools of microscopy.

Up to present the most efficient way for using light to impart mechanical motion has been found by a phenomenon known as radiation-pressure. Radiation-pressure has a long history starting with Johannes Kepler's 1619 postulation as to its role in the bending tail of comets but gained a more rigor foundation once James Clerk Maxwell showed it to be a natural consequence of his newly formed electromagnetic theory [1]. It was first observed by Peter Lebedev in 1901 [2] and shortly after by Nichols and Hull in 1902 [3], and it stirred the well-known Minkowski-Abraham controversy that persists to date [4-5].

Radiation pressure was finally utilized following Ashkin's investigation as to its effect on micron sized object and atoms [6], which led, among other things [7], to the invention of the optical tweezer [8]. Ashkin used ray-optics to show that a transparent particle with refractive index larger than its surroundings is trapped at the focus of a beam. This was the gradient force, so called due to its dependency on a light beam's varying intensity profile. Today, this force, along with its axial counterpart—the scattering force, went beyond ray-optics to include the discrete dipole approximation [9] and the T-matrix calculations [10] such that metallic [11], non-spherical [12], and dispersive [13] objects are all within reach.

Over the years, optical tweezers proved to be a useful bridge between the macro-world we live in and micron-sized objects we wish to use. As such, optical tweezers found ample of use in biology, surface science, and micromechanics to name a few [14]. Albeit the high level of control they provide, which made them such an important tool, their forces are limited to few pico-Newtons [16]. This limitation comes from the fact that radiation-pressure is a momentum transfer process between the electromagnetic wave and the solid object it interacts with [4, 15]. Broadly speaking, the momentum of an electromagnetic wave is P/c, where P is the power. Since c is the speed of light, this momentum is after all feeble. This limitation impinges not just optical-tweezers but other radiation-pressure based approaches as well [17].

It is clear therefore that if large forces are required, an approach other than radiation-pressure should be devised. One possibility is to use the energy of light rather than its momentum. This should not come as a surprise since light is one of nature's most prolific carriers of energy. We therefore developed a mechanism that transforms the electromagnetic energy of light to mechanical motion of microparticles. An example of similar mechanism is the recently demonstrated light activated phoretic motion of asymmetric Janus particles [18]. Since motion, in this case, comes from temperature gradients, and not from the heat generated by absorption of light directly, the resulting forces are relatively small. As a result, the light-driven motion in this case often competes with Brownian motion [18-19], or is comparable to the radiation-pressure axial force at most [20].

Bubbles, vapour voids in liquid, attract interest for well over a century due to their ubiquitous occurrence and their violent dynamic behaviour [21]. It is this fact combined with their ability to efficiently remove large amount of heat [22] that makes them a unique opportunity for inflecting motion on micro-objects with light.

SUMMARY

The present application describes embodiments of a non-tracking solar energy collector comprising:
  a) At least one solar radiation concentrator for collimating and directing the incident solar radiation rays to at least one focal point along the surface of a reactive reflector;
  b) The reactive reflector mounted on top of an external cavity and having at least one transparency zone instantly formed at said at least one focal point of the solar radiation rays, for letting the solar radiation rays enter said external cavity, wherein said transparency zone is constantly moving along the surface of said reactive reflector following the position of said at least one focal point of the solar radiation rays; and
  c) The external cavity containing a solar cell and capable of trapping the entered solar radiation rays by inner scattering of said solar radiation rays on the walls of said external cavity,
    wherein said inner scattering of said solar radiation rays inside said external cavity is preventing solar radiation to escape from said solar cell, thereby minimising solar radiation losses.

In a further embodiment, said external cavity of the non-tracking solar energy collector contains more than one spectrally optimised solar cell and more than one band transmission filters attached to said spectrally optimised solar cells, wherein said band transmission filters having different transmission wavelengths. In a specific embodiment, the solar radiation concentrator may be a reflector or an array thereof, or a lens or an array thereof.

The reactive reflector of an embodiment comprises:
  (a) A separator film having an opening filled with a liquid suspension of highly reflective microparticles, for example, metal-coated glass microspheres in water, and (b) two optically transparent slides, such as commercially available microscope slides, the first optically transparent slide being attached at the bottom of said separator film forming a solid support for said reactive reflector, and the second optically transparent slide being attached at the top of said separator film covering said opening, wherein said separator film is squeezed between two said optically transparent slides, thereby forming a sandwich-like structure.

In a further specific embodiment, the metal-coated glass microspheres are silver-coated or aluminium-coated, having a mean diameter in the range of 1-100 µm, preferably 42-62 µm. In yet further specific embodiment, the separator film (also called a "spacer sheet" in some figures) has a thickness of approximately 100 µm, and the opening in said separator film has a diameter of about 5 mm that determines the effective aperture of the non-tracking solar energy collector.

In another aspect of the present application, a method for manufacturing the reactive reflector comprises the following steps:

(i) Placing the separator film on the first optically transparent slide forming a solid support for said reactive reflector;
(ii) Preparing a diluted liquid suspension of highly reflective microparticles;
(iii) Filling the opening in said separator film with said diluted liquid suspension of the highly reflective microparticles to form a uniform thin layer of said highly reflective microparticles; and
(iv) Placing the second optically transparent slide on top of said separator film, thereby covering said opening and encapsulating said highly reflective microparticles.

Various embodiments may allow various benefits, and may be used in conjunction with various applications. The details of one or more embodiments are set forth in the accompanying figures and the description below. Other features, objects and advantages of the described techniques will be apparent from the description and drawings and from the claims.

BRIEF DESCRIPTION OF THE DRAWINGS

Disclosed embodiments will be understood and appreciated more fully from the following detailed description taken in conjunction with the appended figures.

FIG. 5a shows the bright laser spot as it grazes upon water immersed bead just before motion takes place. The 41-µm in diameter silver-coated glass microsphere and the 405 nm laser beam spot are seen as the respective bright and dark patches.

FIG. 5b shows the sequential image where 40 milliseconds later the microsphere has translated a distance roughly 10 times its size. Note that no trace bubbles are seen in water.

DETAILED DESCRIPTION

Figure 1:
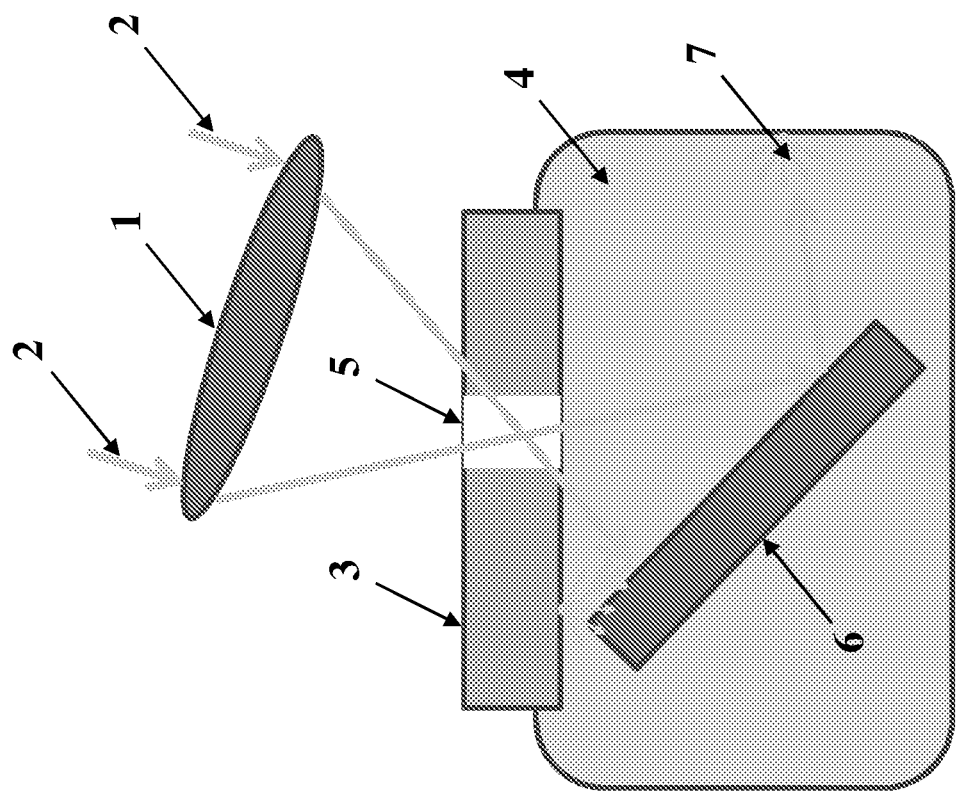
FIG. 1 schematically shows a "naïve" configuration of the non-tracking solar energy collector of an embodiment.

In the following description, various aspects of the present application will be described. For purposes of explanation, specific configurations and details are set forth in order to provide a thorough understanding of the present application. However, it will also be apparent to one skilled in the art that the present application may be practiced without the specific details presented herein. Furthermore, well-known features may be omitted or simplified in order not to obscure the present application.

The terminology used herein is for describing particular embodiments only and is not intended to be limiting of the invention. The terms "comprising" and "comprises", used in the claims, should not be interpreted as being restricted to the means listed thereafter; they do not exclude other elements or steps. They need to be interpreted as specifying the presence of the stated features, integers, steps and/or components as referred to, but does not preclude the presence and/or addition of one or more other features, integers, steps or components, or groups thereof. Thus, the scope of the expression "a device comprising x and z" should not be limited to devices consisting only of components x and z. Also, the scope of the expression "a method comprising the steps x and z" should not be limited to methods consisting only of these steps.

Unless specifically stated, as used herein, the term "about" is understood as within a range of normal tolerance in the art, for example within two standard deviations of the mean. In one embodiment, the term "about" means within 10% of the reported numerical value of the number with which it is being used, preferably within 5% of the reported numerical value. For example, the term "about" can be immediately understood as within 10%, 9%, 8%, 7%, 6%, 5%, 4%, 3%, 2%, 1%, 0.5%, 0.1%, 0.05%, or 0.01% of the stated value. In other embodiments, the term "about" can mean a higher tolerance of variation depending on for instance the experimental technique used. Said variations of a specified value are understood by the skilled person and are within the context of the present invention. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges, for example from 1-3, from 2-4, and from 3-5, as well as 1, 2, 3, 4, 5, or 6, individually. This same principle applies to ranges reciting only one numerical value as a minimum or a maximum. Unless otherwise clear from context, all numerical values provided herein are modified by the term "about". Other similar terms, such as "substantially", "generally", "up to" and the like are to be construed as modifying a term or value such that it is not an absolute. Such terms will be defined by the circumstances and the terms that they modify as those terms are understood by those of skilled in the art. This includes, at very least, the degree of expected experimental error, technical error and instrumental error for a given experiment, technique or an instrument used to measure a value.

As used herein, the term "and/or" includes any combinations of one or more of the associated listed items. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached to", "connected to", "coupled with", "contacting", etc., another element, it can be directly on, attached to, connected to, coupled with or contacting the other element or intervening elements may also be present. In contrast, when an element is referred to as being, for example, "directly on", "directly attached to", "directly connected to", "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealised or overly formal sense unless expressly so defined herein. Well-known functions or constructions may not be described in detail for brevity and/or clarity.

The present application relates to a non-tracking solar energy collector shown in FIG. 1 and comprising:
a) at least one solar radiation concentrator (1) for collimating and directing the incident solar radiation rays (2) to at least one focal point along the surface of a reactive reflector (3);
b) the reactive reflector (3) mounted on top of an external cavity (4) for letting solar radiation rays (2) to enter said external cavity (4),
  said reactive reflector (3) having at least one transparency zone (5) instantly formed at said at least one focal point of the solar radiation rays (2) beyond intensity threshold,
    said at least one transparency zone (5) constantly moving along the surface of said reactive reflector (3) following the position of said at least one focal point of the solar radiation rays (2); and
c) the external cavity (4) containing a solar cell (6) and capable of trapping the entered solar radiation rays (2) by inner scattering of said solar radiation rays (2) on the walls of said external cavity (4),
wherein said inner scattering of said solar radiation rays (2) inside said external cavity (4) is capable of preventing solar radiation to dissipate from said solar cell, thereby minimising solar radiation losses.

The non-tracking solar energy collector of an embodiment can be realised in three different configurations. The first "naïve" configuration is shown in FIG. 1. The solar radiation concentrator in this case is a lens (1) collimating and directing the incident solar radiation rays (2) to a focal point along the surface of a reactive reflector (3). The "reactive reflector" is defined as a reflector becoming transparent beyond certain intensity threshold. The optical lens (1) may be, for example, the axially graded index lens, which gives a completely passive concentration of sunrays. This enables high-efficiency passive flat panels by creating low-cost, miniature, passive concentrator arrays that power high-efficiency photovoltaics.

The reactive reflector (3) is mounted on top of an external cavity (4) and has one transparency zone (5) instantly formed at the corresponding focal point of the sunrays, for letting these sunrays enter said external cavity (4). The transparency zone (5) is capable of constantly moving along the surface of the reactive reflector (3) following the position of the sunrays' focal point. The phenomenon behind this unique movement of the transparency zone (5) will be explained in detail below.

The external cavity (4) contains a solar cell (6) and is capable of trapping the entered sunrays by inner scattering process (7) of said solar radiation rays on the walls of said external cavity (4). The inner scattering of the sunrays inside said external cavity (4) prevents solar radiation from dissipating away of said solar cell (6) and hence, minimises the solar radiation losses.

Figure 2:
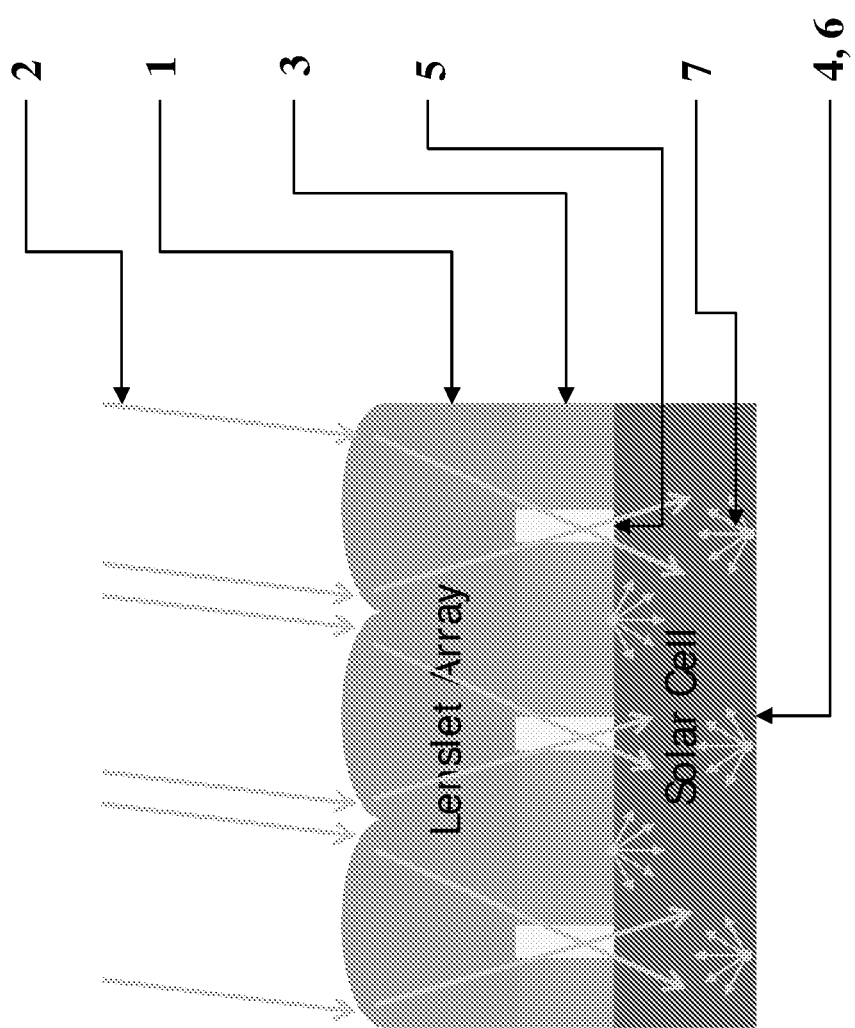
FIG. 2 schematically shows a "flat panel multi-concentrator" configuration of the non-tracking solar energy collector of an embodiment.

FIG. 2 shows a "flat panel multi-concentrator" configuration of the non-tracking solar energy collector of an embodiment. This configuration contains a lenslet array (1) as a solar radiation concentrator. A "lenslet array" can be defined as an array of small lenses (lenslets), wherein each small lens constitutes an inseparable part of the array, is in the same plane with other lenslets of the array and normally has the same focal length as other lenslets of the array. Since there are several lenslets in the solar radiation concentrator (I), there will be several focal points formed by the collimated sunrays (2) along the surface of the reactive reflector (3). As a result, several transparency zones (5) will instantly form at the corresponding focal points of the sunrays and let these sunrays enter said external cavity (4). The reactive reflector (3) is mounted on top of the external cavity (4) containing a solar cell (6). The multiple transparency zones (5) are capable of constantly moving along the surface of the reactive reflector (3) following the position of the sunrays' focal point. The external cavity (4) is capable of trapping the entered sunrays by inner scattering process (7) of said solar radiation rays on the walls of said external cavity (4). The inner scattering of the sunrays inside said external cavity (4) prevents solar radiation from dissipating away of said solar cell (6) and hence, minimises the solar radiation losses.

Figure 3:
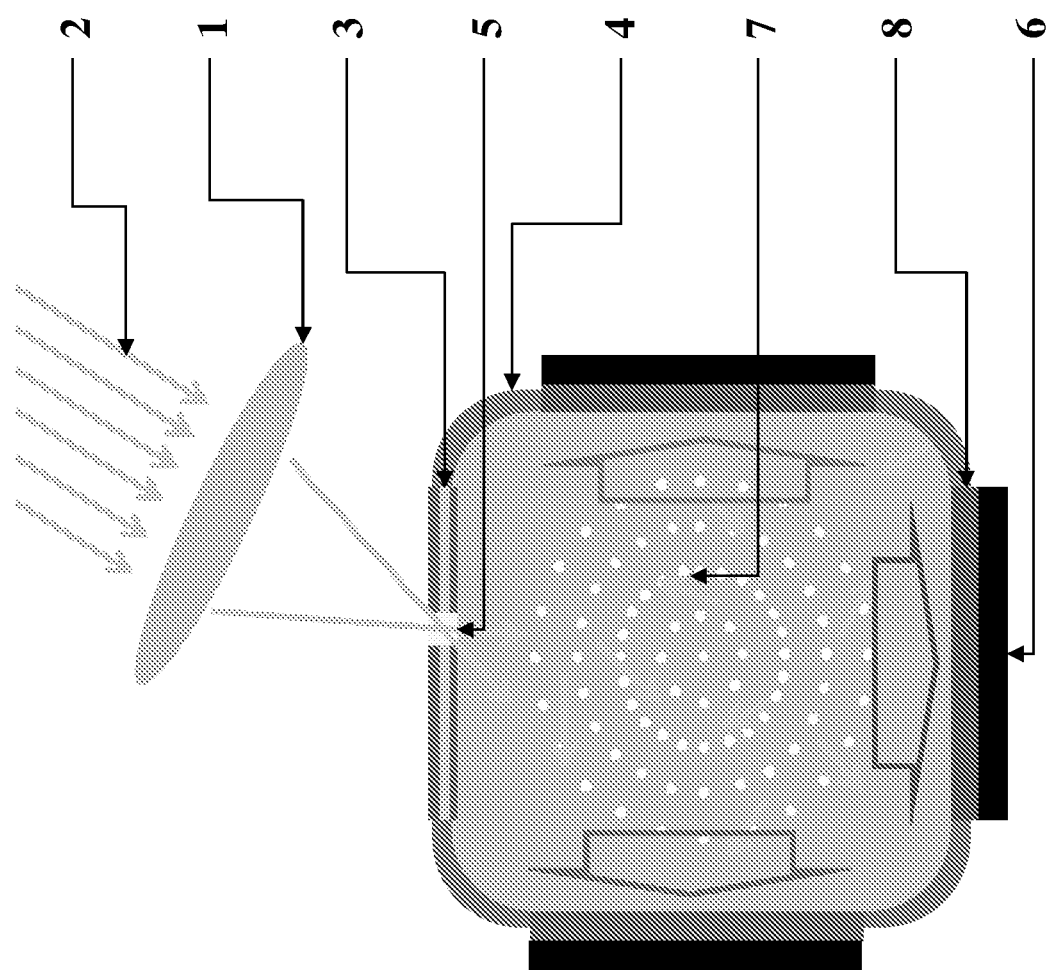
FIG. 3 schematically shows a "spectral splitting" configuration of the non-tracking solar energy collector of an embodiment.

Reference is now made to FIG. 3 showing the so-called "spectral splitting" configuration. In this particular configuration, the solar radiation rays (2) enter the solar radiation concentrator (1), which may be a lens or an array thereof. The solar radiation concentrator (1) collimates and directs the incident sunrays (2) to a focal point along the surface of a reactive reflector (3). The reactive reflector (3) is mounted on top of an external cavity (4) and has at least one transparency zone (5) instantly formed at the corresponding focal point of the sunrays, thereby letting these sunrays enter said external cavity (4). The transparency zone (5) is capable of constantly moving along the surface of the reactive reflector (3) following the position of the sunrays' focal point.

The spectral splitting configuration shown in FIG. 3 is characterised by having an external cavity (4) containing more than one spectrally optimised solar cell (6) and more than one band transmission filter (8) attached to the corresponding spectrally optimised solar cell (6), wherein said band transmission filters (8) have different transmission wavelengths. The external cavity (4) is capable of trapping the entered sunrays by inner scattering process (7) and preventing solar radiation from dissipating away of said solar cells (6) and hence, minimising the solar radiation losses.

Figure 4:
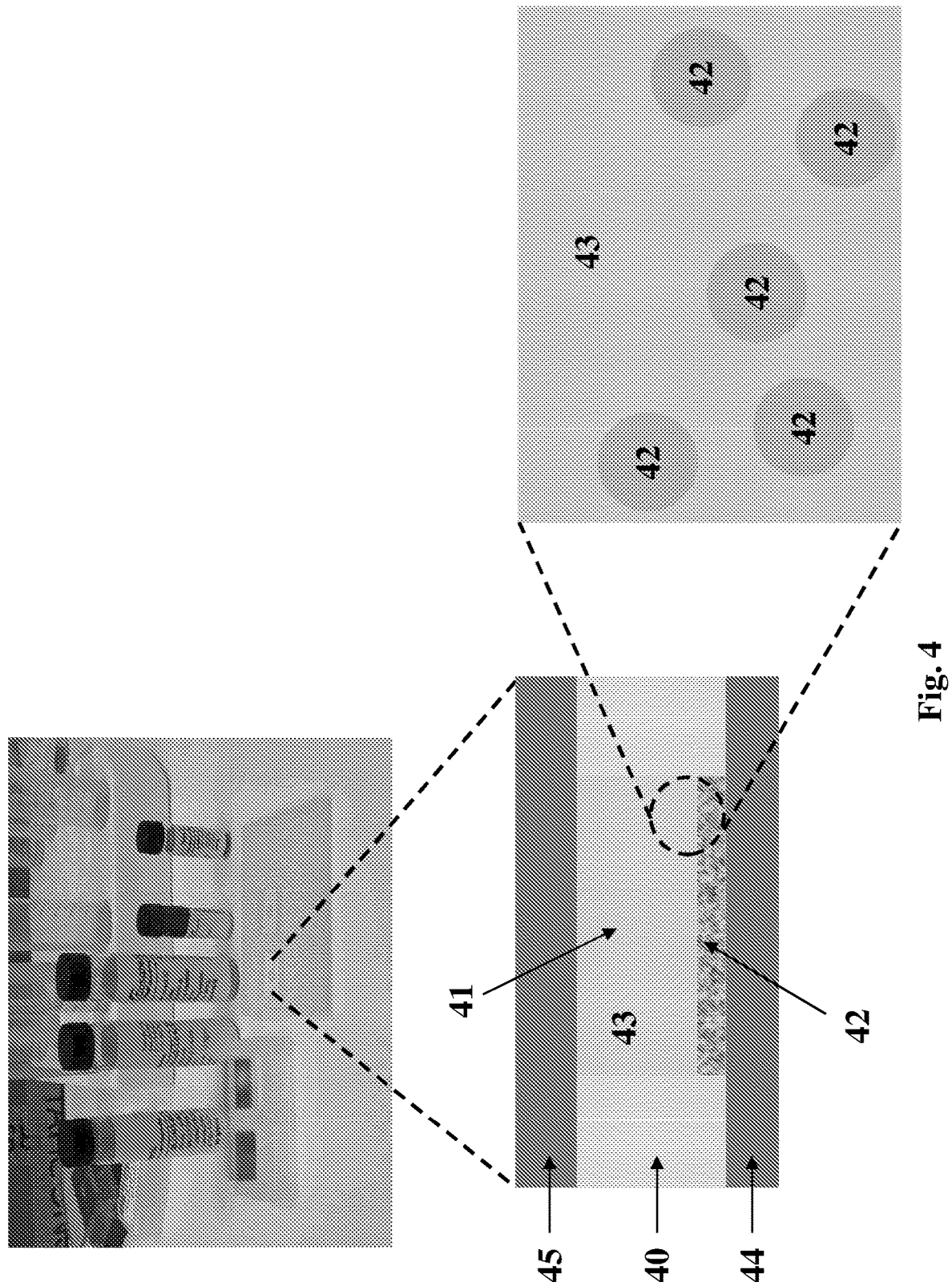
FIG. 4 schematically shows the reactive reflector of an embodiment.

FIG. 4 schematically shows the reactive reflector of an embodiment comprising:
(a) a separator film (or spacer sheet) (40) having an opening (41) filled with a suspension of highly reflective microparticles (42), such as metal-coated glass microspheres, preferably silver-coated or aluminium-coated, in a liquid (43), such as water, and (b) two optically transparent slides (44, 45), the first optically transparent slide (44) being attached at the bottom of said separator film (40) forming a solid support for said reactive reflector, and the second optically transparent slide (45) being attached at the top of said separator film (40) covering said opening (41), wherein said separator film (40) is squeezed between two said optically transparent slides (44, 45), thereby forming a sandwich-like structure.

The highly reflective microparticles (42), such as metal-coated glass microspheres, preferably silver-coated or aluminium-coated, may have a mean diameter in the range of 1-100 µm, preferably 42-62 µm. The separator film (40) may be any suitable polymer, specifically plastic, film having a thickness of about 100 µm. The opening (41) inside the separator film (40) may have a diameter of about 5 mm that determines the effective aperture of said non-tracking solar energy collector. The two optically transparent slides (44, 45) may be chosen from any commercially available microscope slides.

A method for manufacturing the reactive reflector of an embodiment comprises the following steps:
(i) Placing the separator film (40) on the first optically transparent slide (44) forming a solid support for said reactive reflector;
(ii) Preparing a diluted liquid suspension of highly reflective microparticles (42) in immersion liquid (43);
(iii) Filling the opening (41) in said separator film (40) with said diluted liquid suspension of the highly reflective microparticles (42) in immersion liquid (43) to form a uniform thin layer of said highly reflective microparticles (42); and
(iv) Placing the second optically transparent slide (45) on top of said separator film (40), thereby covering said opening (41) and encapsulating said highly reflective microparticles (42).

The present inventors found that the energy of electromagnetic waves can be effectively converted into the motion of the reflective microparticles (42) immersed in liquid (43), such as water. This is achieved by taking advantage of the efficiency of phase-transitions in converting heat to other forms of energy, and on the ferocity of the dynamic behaviour of bubbles. The proposed approach is demonstrated by propelling the microparticles (42) with the equivalent forces that are six orders of magnitude larger than what was achieved to date. The explosive nature of the phase-transition and the ensuing expansion and later full liquidation of the bubble last no more than 50 µs in this case. Nonetheless, comparing the measured bubble to known models indicates that the process is mostly adiabatic, i.e. with minimal dissipation of energy, apart from the obvious acceleration of the sphere.

Thus, the reactive reflector of an embodiment capable of binary switching from opacity to transparency based on the above approach constitutes the major aspect of the present application. The binary switching from opacity to transparency is achieved by large-scale reorganisation of a colloidal substance that demands forces that were so far unattainable with light. The proposed approach is not limited to the solar energy collection, but can also be used in micro-fluidics, micro-heat engines and pumps, and micro-machines in general.

The present application demonstrates the light-activated motion of micron-sized particle and analyses the Electromagnetic Energy to Mechanical Energy Transfer (EMMET) that takes place using a high-speed camera and known models of the bubble dynamics. Reference is now made to FIGS. 5a-5b showing two sequential images out of a rolling video capture of such an event. FIG. 5a shows the bright laser spot as it grazes upon water immersed bead just before motion takes place. The bead in this case is a 50-μm silver-coated glass sphere that is immersed in water and capped between two standard microscopic cover slips. The sample was illuminated form the top with a white light source for imaging and from the bottom with 405 nm laser to inflect EMMET. For a more detailed description of this experiment, see the experimental section.

FIG. 5b shows the sequential image where the microsphere had traversed a distance more than 10 times its size. Note that no trace bubbles remains in the liquid. The effective force in this case can be estimated by $m\Delta x/\Delta t^2$ to be in the range of micro-newton, where $m\Delta x$ and $\Delta t$ are the mass duration and translation of the translated object. This force is more then an order of magnitude larger then what could be expected from the radiation pressure based approaches using the same laser intensity. Further analysis described below shows that this force is in fact six orders of magnitude larger then what was observed to date. Moreover, the laser is focused here with simple X20 objective having a low numerical aperture of 0.4, while optical-tweezers often use the oil-immersed objectives with numerical aperture >1. This simple comparison shows the huge potential of the proposed EMMET approach as a long-distance high-power light-activated motion of microparticles.

Figure 6:
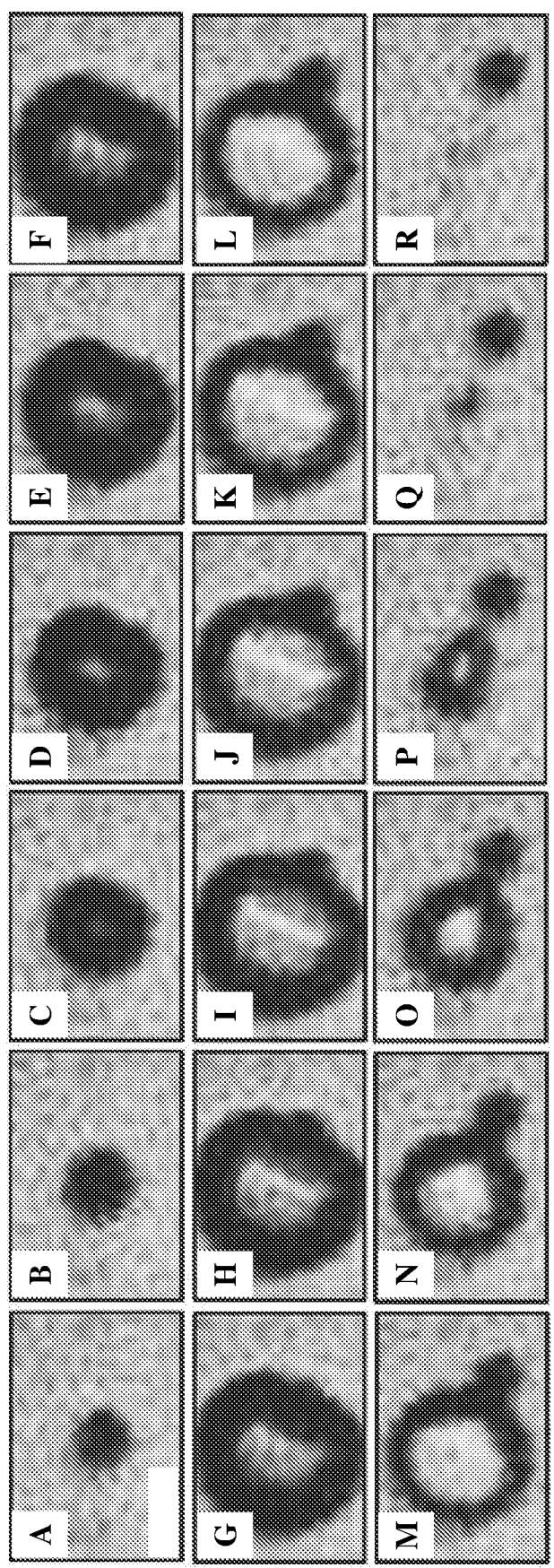
FIG. 6 presents a consecutive set of images obtained at a rate of 500,000 frames per second with a high-speed camera, showing the evolution of the bubble at the 41-µm in diameter silver-coated glass microsphere at 2-ms time steps (from A to R). Image (A) shows the microsphere prior to the formation of the bubble (right before the bubble first becomes visible), Image (H) shows the bubble at its maximal radius, and Image (R) shows the translated microsphere after the bubble completely disappeared.

In order to get a better grasp on the processes that take place during the onset of the EMMET, a series of images were obtained at a rate of 500,000 frames per second with a high-speed camera. FIG. 6 presents a consecutive set of images obtained at a rate of 500,000 frames per second with a high-speed camera, showing the evolution of the bubble at the 41-μm in diameter silver-coated glass microsphere at 2-ms time steps (from A to R). Image (A) shows the microsphere prior to the formation of the bubble (right before the bubble first becomes visible), Image (H) shows the bubble at its maximal radius, and Image (R) shows the translated microsphere after the bubble completely disappeared. The 405-nm laser's spot is not visible on the images due to the presence of the long-pass filter (Thorlabs FEL500) placed on the imaging path. The expanding dark rim indicates the progression of the vapour/liquid interface, which is actually the bubble. The bright region at the centre of the bubble that appears starting in the Image (D) shows where the vapour has reached the glass slides. At these instances, the bubble is more of a disc then a sphere.

The inventors have also tested whether the bubbles could develop a more spherical shape due to the larger separation between the transparent slides that was maintained by the separator film as defined above. These, however, displayed similar dynamics but with less crisp imagery and are therefore are not demonstrated in the present application but available on request. The next two Images (E) and (F) show in in FIG. 6 demonstrates that the bubble develops a dent as it expands. This dent is caused by the microsphere whose progression at this stage still lags behind the advancing bubble front. The microsphere eventually begins to perturb starting at Image (H). Images (G) and (H) show the bubble at it maximal extent, from there onward, the bubble begins to collapse while the microsphere continues at its original course. This causes the dent in the bubble to become a bulge that finally resembles somewhat the effect of the bubble pinch-off [23], as can be clearly seen in Image (M).

Finally, the bubble and the microsphere separate, as can be seen in Image (P). From there on the microsphere is freely moving in water, while the bubble continues to disappear until it vanishes completely. Although none of the two events was identical, the similar trends were observed for hundreds of instances, and with different particle sizes.

Figure 7A:
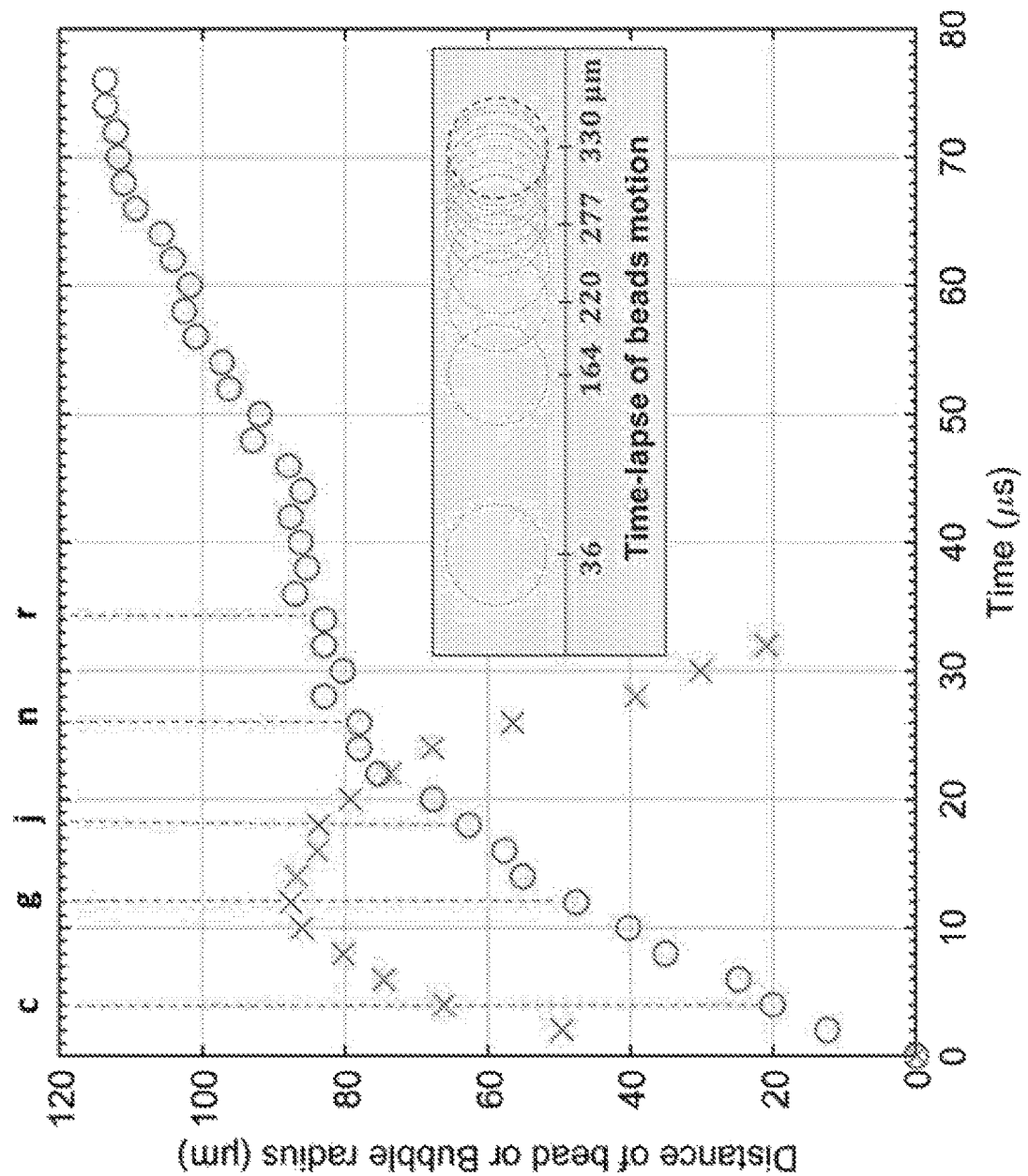
FIG. 7a shows typical micro-sphere motion and the corresponding bubble radius. Micro-sphere location is shown with blue 'o' marks while the radius of the bubble with orange marks. Letters corresponds to a respective frame in FIG. 6. Inset depicts the motion of a typical micro-sphere after the bubble has vanished with 200 µs between consecutive locations.
Figure 7B:
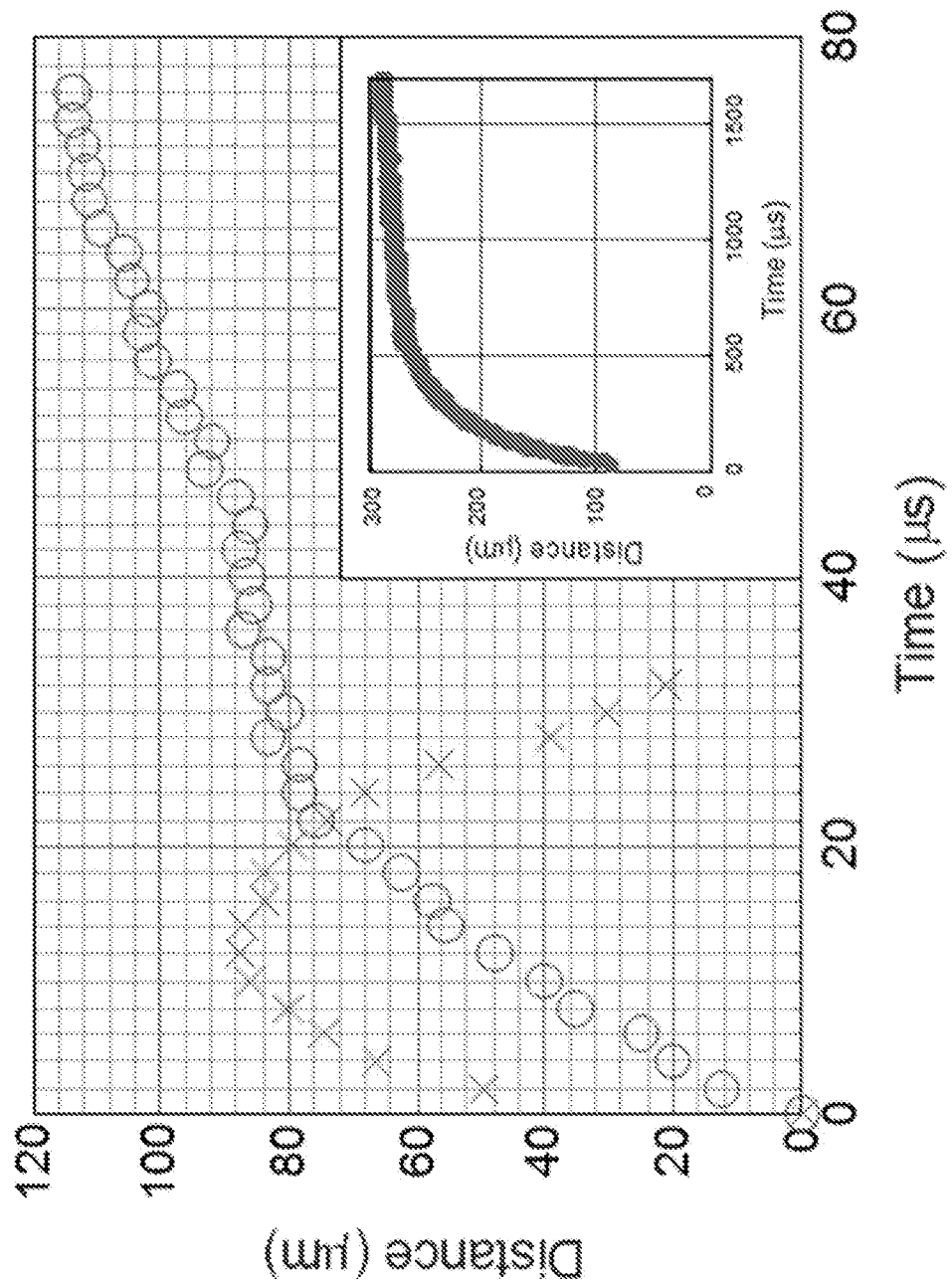
FIG. 7b shows the distance that a typical sphere travels from its initial location versus time (open circles) and the corresponding bubble radius (crosses).

FIG. 7a shows typical micro-sphere motion and the corresponding bubble radius. Micro-sphere location is shown with blue 'o' marks while the radius of the bubble with orange 'x' marks. Letters corresponds to a respective frame in FIG. 6. Inset depicts the motion of a typical micro-sphere after the bubble has vanished with 200 between consecutive locations. FIG. 7b is actually the same FIG. 7a, but with the inset showing a larger scale of the microsphere progression, i.e. the distance which a typical sphere travels from its initial location versus the travel time (open circles) and the corresponding bubble radius (crosses). For the travel times shorter then about 12 μs, the bubble and the microsphere are practically undistinguishable. Starting from 30-45 μs, there is a significant slowing down of the microsphere's progression to a complete halt. The open circles in FIGS. 7a and 7b actually mark the location of the centre of the microsphere, and this corresponds to the (A)-(R) images shown in FIG. 6. The time scale, however, was extended beyond what was shown before. The effective bubble radius shown as the crosses in FIGS. 7a and 7b was obtained from the observed surface of the bubble S by the equation $\tilde{R}=\sqrt{S/\pi}$. This choice mitigates the effect of bubble deformation and thus allows better comparison with the known analytical models that would be described below.

There are few things, which are noticeable. First, the expansion stage, from bubble initiation and up until the turning point at 12 μs, is mirrored at the collapse stage of the bubble up until 26 μs. This is a clear indication that inertially controlled bubble dynamics, where the bubble does not dissipating energy to its surroundings, prevails. Known dissipation mechanisms in this case are mass transfer between vapour and liquid [24], heat transfer within the bubble and through the bubble wall to its surroundings [25], the viscosity of water, as well as the emission of shock waves [26]. The first two are not expected to take affect here since the typical time scales for evaporation is milliseconds [24] and the characteristic time for thermal diffusivity $t_T=\tilde{R}_0^2/\alpha_g \approx 100$ μs is longer than the typical pulsation time of our bubble, which is approximately 40 μs (if thermal diffusivity coefficient of vapor $\alpha_g=2.338\times10^{-5}$ m·s$^{-2}$ is taken along with typical bubble radius $\tilde{R}_0=50$ μm). Dissipation due to viscosity of water, as well as the emission of shock waves, is likewise not expected throughout the observed motion of the bubble since the velocity, as seen in FIGS. 7a and 7b, does not exceed 5 m·s$^{-1}$. Rapid events of intense evaporation or condensations, however, with probable emission of shock waves, are expected but only at the very early last stages of the pulsation, as will be explained later.

In the present case, one must consider the mutual interaction between the microsphere and the bubble. Clues to this mechanism are given by the sudden slowing down of the microsphere that can be seen at about 24 μs. FIG. 6 shows that by that time, the microsphere is significantly perturbed beyond the realm of the bubble. This suggests that the slowing down is probably caused by friction of the microsphere with the surrounding water bulk. Before that time, the microsphere-water friction is minimal since the microsphere is submerged in the bubble and therefore is co-moving with the water bulk, close to the advancing bubble front. Likewise, the slowing down of the bubble is seen at 28 μs as well. This, however, may be an artefact of the large deformation of the bubble that is seen in Images (N)-(R) in FIG. 6, or indication of the early stages of condensation rather than the effect of the microsphere friction. An insert in FIG. 7b shows a larger scale of the microsphere progression in water until a complete halt is reached after the microsphere had traveled 280 μm from its initial location.

In order to gain a better insight in the phenomenon described above and in the processes beyond the present detection limit, the obtained experimental results can be compared with an analytical model of a spherical bubble. In order to mitigate the specific artefact of each EMMET event, the 55 tests with the same microsphere were recorded and the 8 tests with the larger observed bubble radius were chosen as a representative set. For a detailed description of this experiment, see the experimental section.

Figure 8:
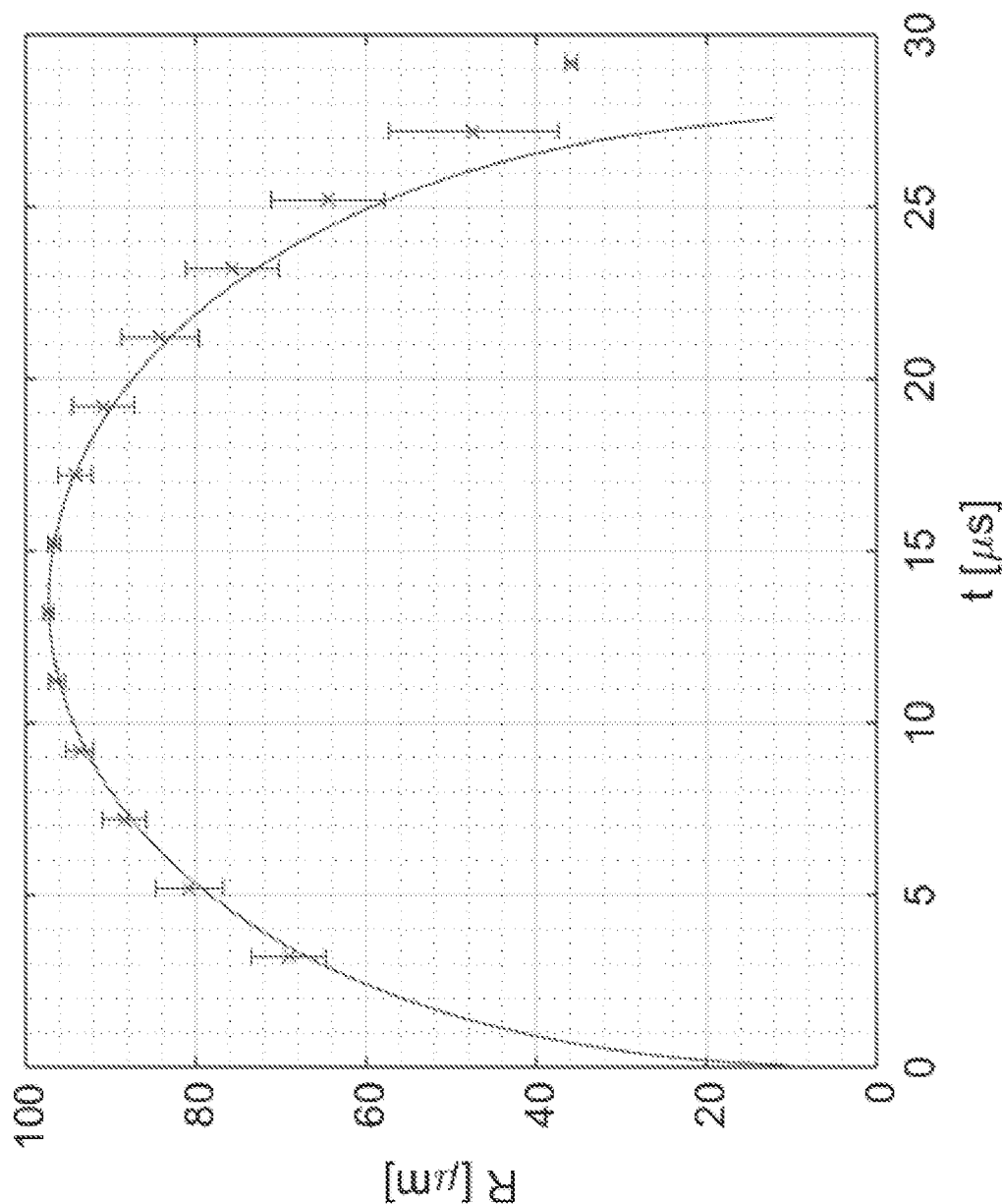
FIG. 8 shows evolution of the effective bubble radius with time. Blue 'x' marks shows average bubble radius with error bars depicting the standard deviation in observation. The experimentally measured average bubble radius is shown as crosses (with the standard deviation error bars), while the solid line shows expected dynamics of the inertially controlled spherical bubble.

FIG. 8 shows evolution of the effective bubble radius with time. Blue 'x' marks shows average bubble radius with error bars depicting the standard deviation in observation. The experimentally measured average bubble radius is shown as crosses (with the standard deviation error bars), while the solid line shows expected dynamics of the inertially controlled spherical bubble. This trend is compared with an analytical model for the dynamics of spherical bubbles in the form of the well-known Rayleigh-Plesset equation [25, 27, 28]:

$$P_V(t) - P_\infty - P_S = \rho\left[R(t)\ddot{R}(t) + \frac{3}{2}\dot{R}(t)\right] \quad (1)$$

where R(t) is the instantaneous bubble radius, $P_\infty$ is the pressure of liquid far away from the bubble, ρ is the density of water, and the overdot represents the variable time derivative. The inertial behaviour of the bubble is preserved in this case by adopting a polytropic model for the trapped vapour inside the bubble [25, 28]:

$$P_V(t) = P_0\left(\frac{R_0}{R(t)}\right)^{3\gamma} \quad (2)$$

where $P_0$ and $R_0$ are the initial pressure and bubble radius, respectively, and γ is the vapour adiabatic constant. Finally, the pressure due to surface tension is given by Young's equation:

$$P_S(t) = \frac{2S}{R(t)} \quad (3)$$

where S is the surface tension coefficient.

Equations (1), with insertion of (2) and (3), can be integrated numerically to produce the solid line shown in FIG. 8. The initial pressure is chosen to be at the critical point of water, i.e. $P_0$=22.064 MPa, and the adiabatic bubble dynamic was guaranteed by taking γ=1.33. Also, the density and surface tension were taken to be ρ=1000 kg/m³ and S=0.07 kg/s². The ambient pressure $P_\infty$=44 kPa, and the initial radius, $R_i$=6.45 μm, were taken as fitting parameters. The agreement of the model with the experimentally measured data is surprisingly good considering that for most part, the bubble is more of a disc than a sphere, and more so, has a microsphere attached to its surface. The good agreement, however, may be supported by the fact that the Rayleigh-Plesset model for 2D bubbles is similar to Equation (1) up to the pre-factors of the different terms on the right-hand side [29].

FIG. 8 shows, beyond the good agreement, the deviation that exists at the early stages of inflation, and more so at the later stages of collapse, which points to the non-adiabatic process that takes place at the very early and final instances. An indication of the duration of these processes is given by the pressure equalization time $t_P = \tilde{R}_0/c_g$, which is approximately 0.1 μs for $\tilde{R}_0$=50-ρs bubble and speed of the sound in vapour of $c_g$ approximately 477.5 m/s. Clearly, such short time scales are below the present detection limit. The first and foremost, in these non-adiabatic processes, is the evaporation that must have occurred as the bubble first formed. The second is the condensation that finally dissolved it. These could also emit a shock wave, an assumption supported by the faint but audible 'click' sound that accompanied the onset of the EMMET event.

Based on the above experimental observations and the comparison with the analytical model, the following sequence of events is proposed to take place during the onset of the EMMET event. First, the surface of the sphere is heated by absorbing light form the laser. This heating raises the temperature until a film of nearby water becomes superheated. The duration of this stage varied from few seconds at low laser power, and down to few milliseconds for 100-mW full power. These time scales are confirmed by the finite-element simulation of the heating process that is exemplified in the experimental section of the present application. The filament of saturated liquid then makes a phase transition to become a high-pressure vapour. The good agreement of the model indicates that the conditions at this stage are close to the critical point of water, a situation somewhat resembling steam-explosion [30] only at much smaller scales. The duration of this event is probably close to the pressure equalization time, which is 0.1 μs in the present case. This time is a way too short to inflict a significant motion on the microsphere as seen in Images (A)-(B) in FIG. 6 showing that by 2 μs, the location of the microsphere is largely unchanged. The later disagreement of the adiabatic model from the bubble dynamics indicates that this embryonic stage is highly non-adiabatic.

As the bubble expands, the vapour cools and pressure is dropping until an adiabatic relation between the two is achieved, as given by Equation (2). This is also the stage where the bubble is first observed. The microsphere at this stage is carried with the advancing bubble front. The constant slowing down of the bubble that is seen throughout both FIGS. 6 and 7a-b indicates that by this time, the internal vapour pressure $P_v$ has dropped below the combined pressure of the ambient and surface tension, $P_\infty$ and $P_s$, respectively.

At some point the inertia of the bubble is exhausted, and the bubble begins its collapse, but still in an adiabatic manner. The bubble is however not a perfect sphere, and while most of it recedes the microsphere and the vapour/liquid interface that surrounds it, probably via the three phase contact line [22], it still continues moving outwards with the constant velocity. Due to this opposite trend, the bubble develops a significant deformation and the microsphere is slowing down until the complete separation is reached. The microsphere is now freely moving in water, and the bubble undergoes its final non-adiabatic stages of condensation back to the liquid phase. The small acceleration that the microsphere experiences in FIGS. 7a-b after 44 μs indicates that the bubble-microsphere interaction may not be over even after the visual disappearance of the bubble, which may be caused by the shock waves. It is important to note that this final acceleration is a typical occurrence and not particular to the specific EMMET event that was analysed in the present experiments.

Although the proposed EMMET approach shares some obvious similarities with the radiation-pressure-based approaches (mainly being light-activated), some fundamental differences do prevail due to their fundamentally different origin. Being based on momentum transfer, radiation-pressure is instantaneous and linear with the intensity of the lights source. The EMMET process, on the other hand, comprises a chain of events (electromagnetic energy→heat in microparticle→heat conduction to water→phase change in water→rapid bubble dynamics→kinetic energy of microparticle) that are neither instantaneous, nor they are linear. Below is some critical intensity of the light source. For example, the rate of the heat removal from the heated spot on the microsphere and to its surroundings is sufficient to prevent the occurrence of the phase change in water, and therefore, prevents the EMMET from ever to occur. Above that critical intensity, the EMET is certain, but the period of heating would vary, even for separate heating with the same particle. For high enough laser intensity, however, about 100 mW in the present case, the EMMET onset seems to be almost immediate with typical heating period of few milliseconds only.

Albeit the above obvious differences, the two are compared by assigning the equivalent force to the EMMET process, which is the force that it takes to drive the microsphere to a prescribed speed at a particular time. In FIGS. 7a-b, it is clearly seen that about 40 µs after initiation, the microsphere is freely moving in water at a velocity V=0.75 m/s. Taking into account that the microsphere was made almost entirely from glass (density 2.5 gr/cm$^3$) and its diameter was 40 µm, its mass is calculated to be M=84× $10^{-12}$ kg. The linear momentum of the bead at that stage of its motion is therefore P=M×V=63×$10^{12}$ kg·m·s$^{-1}$. From the mean value theorem that P=∫Fdt≈F̃Δt, taking into account the typical time scale Δt=40 µs, the effective force F̃ is calculated to be approximately 1.6×$10^{-6}$ N. Taking into account this number, the radiation-pressure force can be now estimated from the same light source acting on the same microsphere.

The EMMET process is initiated by the 100-mW power laser beam with the wavelength λ=405 nm. Since each photon carries energy ℏω about 5×$10^{-19}$ Joule, the photons must arrives at a rate of R=2×$10^{17}$ s$^{-1}$. Since the momentum of each photon is p=1.6×$10^{-27}$ kg·m·s$^{-1}$, the maximal force that this beam can deliver is F=2×p×R≈6.7×$10^{-10}$ N. This shows that the EMMET was able to exert, in practice, the force that is four orders of magnitude larger than the theoretical limit of the radiation-pressure. Note that this theoretical limit is in fact the uppermost limit. Considering the laser focusing and the spherical shape of the microsphere, the gradient and scattering forces are even smaller. Optical tweezers, for example, delivers forces in the pico-Newtons range at similar conditions [16]. It is therefore clear that changing the paradigm from momentum to energy transfer allows using light to manipulate micro-sized objects with forces up to six orders of magnitude larger than what was achieved to date on.

Thus, the non-tracking solar energy collector of an embodiment has an ability of binary optical switching form opacity to transparency due to the reflective reactor utilising the above-explained EMMET phenomenon. As described above, the reactive reflector of an embodiment is formed by loading microparticles into the opening filled with water until highly dense suspension of the microparticles is formed. This highly dense suspension efficiently blocks the transmission due to the reflective/absorptive nature of each microparticle. This situation is illustrated in FIG. 9a, when the dense suspension of particles blocks the transmission of light due to the reflective/absorptive nature of the microspheres. When light is focused onto the layer of the microparticles, the EMMET occurs that repels the microparticles from the high intensity light beam path such that light transmission increases as schematically shown in FIG. 9b.

Figure 9C:
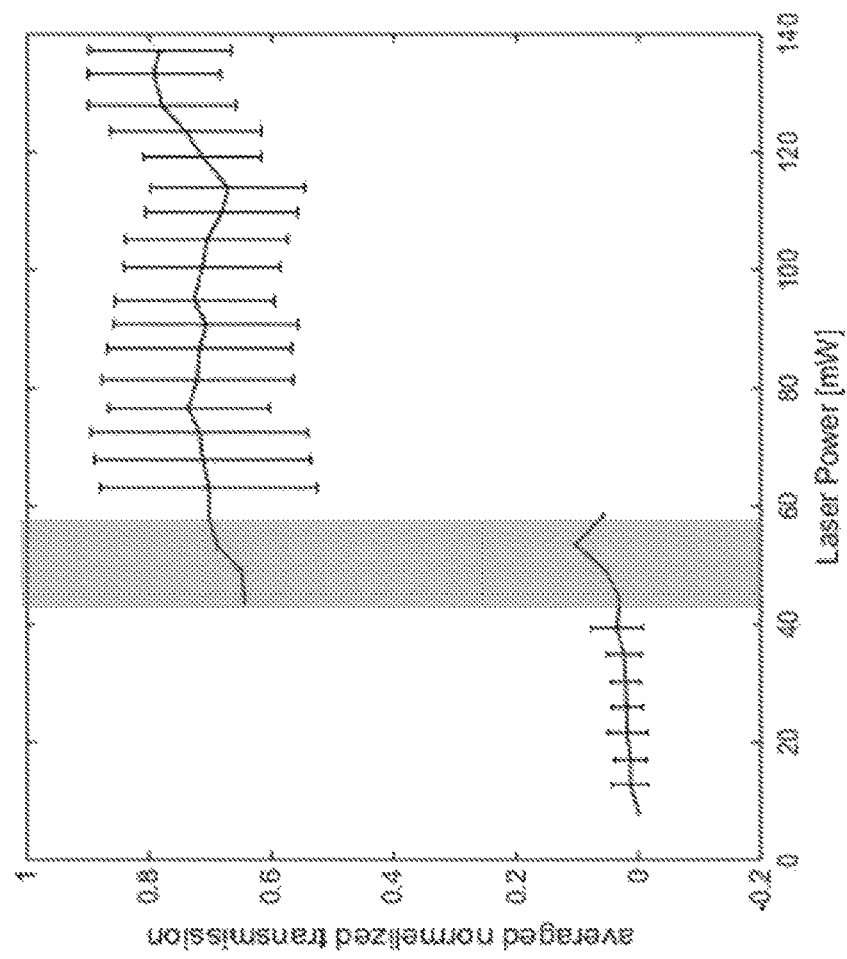
FIG. 9c shows the average of 10 normalized transmission measurements (transmission versus incoming laser power). The jump between 40-60 mW indicates the critical power of the laser beyond which the reactive reflector becomes transparent at the focal point.
Figure 9A:
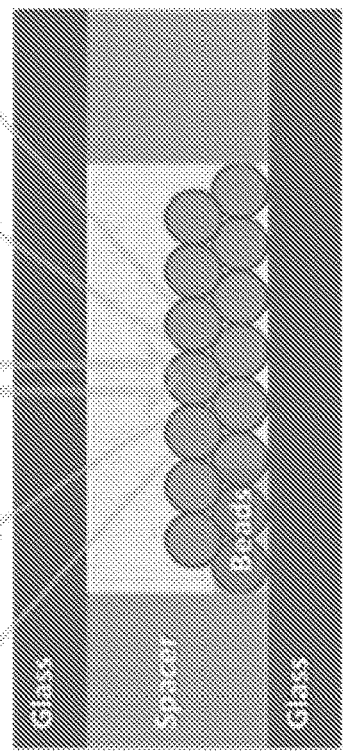
FIG. 9a schematically shows a highly dense suspension of microparticles that blocks transmission by reflecting and absorbing the incoming focused light at mild to low intensities.
Figure 9B:
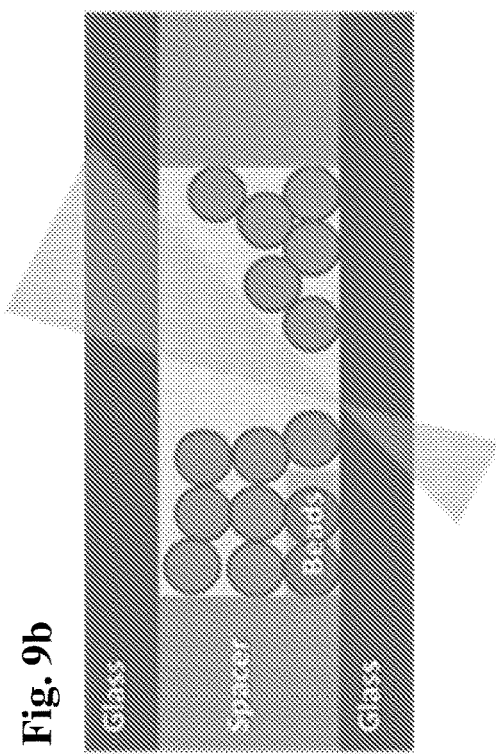
FIG. 9b schematically shows the situation when the focused light above the critical power level removes the microparticles out of the light beam path such that transparency emerges.

FIG. 9c shows the average of 10 normalized transmission measurements (transmission versus varied laser intensity). The jump between 40-60 mW indicates the critical intensity range of the laser, beyond which the reactive reflector becomes transparent at the focal point. This ability of the microparticles that originally form a non-transparent layer to be propelled and reorganised around a moving laser beam has never been shown before. This phenomenon may gain an interest not only in the solar energy conversion applications, but also for controlling processes in microfluidic chips, design of micro-robots, as well as for therapeutic, diagnostic, and performing medical in vivo tasks.

Existing radiation-pressure or thermophoresis based approaches produce relatively small forces not exceeding few pico-Newtons. The present inventors found a way to directly convert light's energy into kinetic energy for water immersed micron-sized objects. The approach is based on the efficiency phase transition in transporting and converting heat to other forms of energy, and on the ferocity of the bubble dynamics, which is able to propel micron-sized objects to unprecedentedly high velocities of meters-per-second, or to act on them with equivalent forces of micro-Newtons. Both of these figures of merits are six orders of magnitude larger than what was obtained so far.

In addition, the proposed approach is reversible in the sense that no trace of the bubble remains few tens of microseconds after the bubble first emerges. The present experiments clearly indicate that, with the exception of few microseconds at the initiation and at the final stages of the bubble collapse, the process is adiabatic, i.e. it occurs with the minimal energy dissipation.

The opportunities that the described and claimed devices and methods offer are demonstrated with the realization of a disordered photonic device that undergoes a binary transformation from being opaque to becoming transparent depending on the intensity of light that falls on its transparent surface. It is important to note that the directivity of motion in the present case was achieved by focusing light on the respective surface of a large symmetric object in the form of metal-coated glass microspheres of approximately 50 µm. It should be however noted that the invention is not limited to the solar energy conversion devices and methods, but may be used in any other devices and methods requiring the movement of particles with light, for example in medical devices and procedures, microfluidics, robotics and military applications.

While certain features of the present application have been illustrated and described herein, many modifications, substitutions, changes, and equivalents will be apparent to those of ordinary skill in the art. It is, therefore, to be understood that the appended claims are intended to cover all such modifications and changes as fall within the true spirit of the present application.

EXAMPLES

Experimental Setup and Sample Preparations

Figure 10:
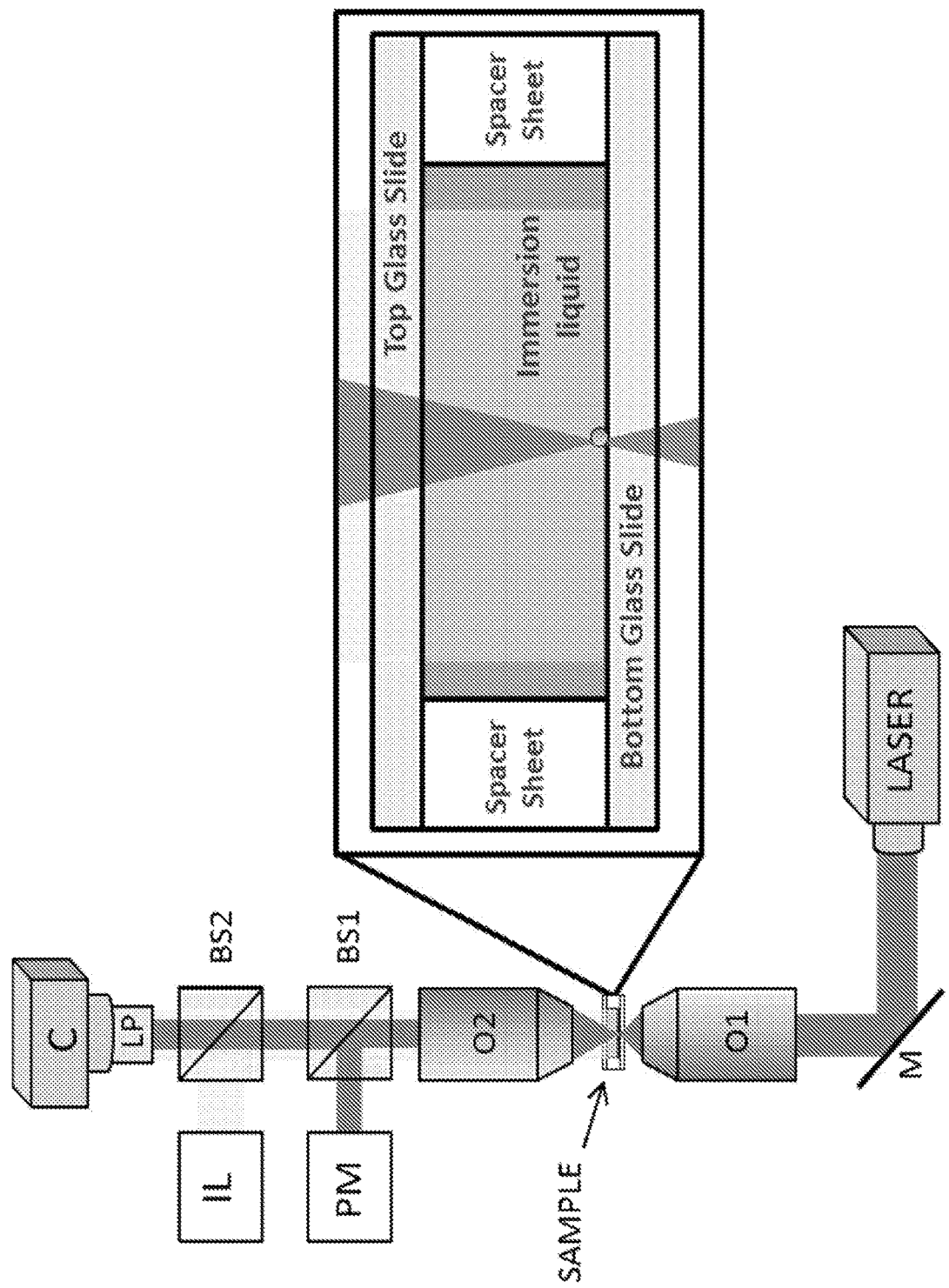
FIG. 10 schematically shows the optical setup used in the experimental measurements of the Electromagnetic Energy to Mechanical Energy Transfer (EMMET) process and in the development of the prototype reactive reflector of an embodiment.

FIG. 10 schematically shows the system of the experimental setup. Illumination from a 405-nm diode laser (L) is focused onto the sample by a 45° mirror (M) and by an objective Newport M-20x 0.4NA (O1). The transmitted light from the sample is collected for imaging and transmitted power measurements by a second objective, Leica Achro 4/0.1 (O2). Two 10:90 and 50:50 beam splitters, BS1 and BS2 respectively, are used to direct transmitted light to a power meter (PM) and light from the illuminator (IL) to the sample for back sample illumination of the imaging video camera (C). Imaging is obtained with this camera (C). A long-pass filter (LP) is used to block the undesired laser light from reaching the camera.

Different cameras were used throughout the experiments. For example, the images in FIG. 6 were taken with a high speed camera Phantom v1211 from Vison Research USA. A long-pass filter Thorlabs FEL0500(LP) blocks the undesired laser light from reaching those cameras. The sample, whose enlarge schematic depiction is also shown in the figure, is composed from glass microspheres that are coated with a thin 200 nm layer of silver form Cospheric USA, part number SLGMS-AG-2.5 43-62 μm. The diameter of a typical microsphere (microparticle) that was examined varies between 40 μm to 60 μm.

The microspheres come as a dry powder that was later immersed in distilled water and placed between two glass cover slides. When separation between slides was required, as for example in the experiments leading to FIG. 7, a 90 μm plastic separator film (spacer sheet) was inserted between the two transparent glass slides. For the high speed video measurements, each frame comprised of 128×32 pixels that allowed a rate of 500,000 frames per second at exposure of 1.8 μs (2 μs between each frame). The images shown in FIG. 6 were acquired without the separator film between slides for a crisper view of the spheres motion that was somewhat suppressed in-turn.

Bubble Radius and Microsphere Location

Figure 11:
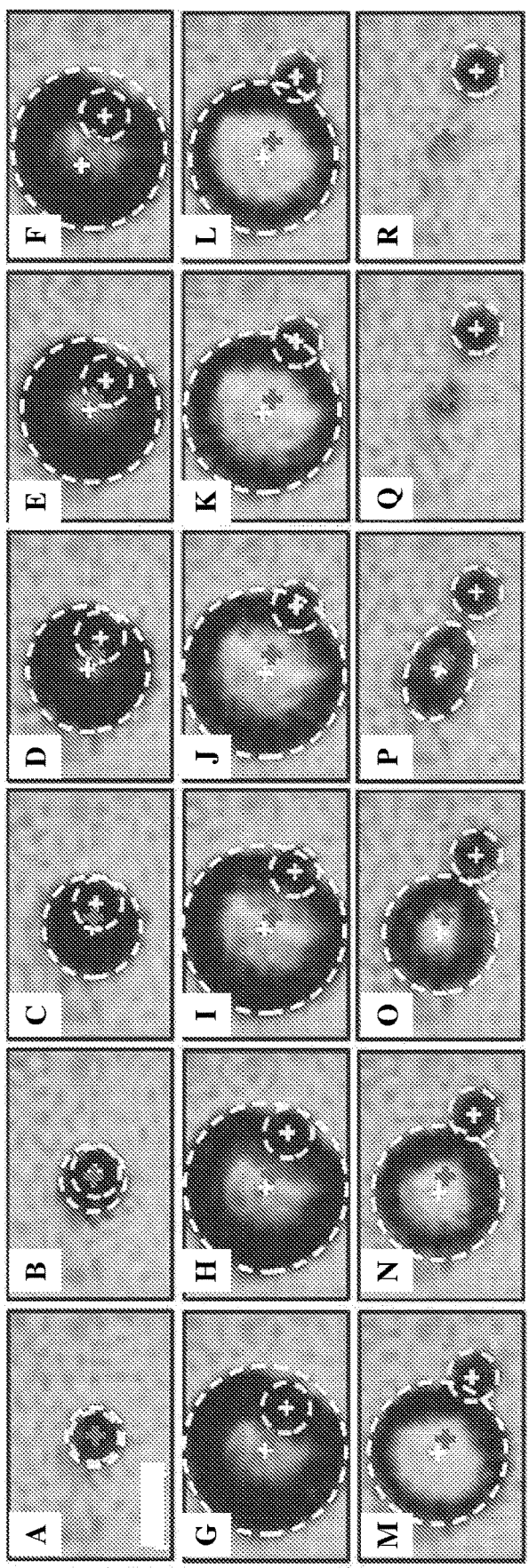
FIG. 11 is the augmented FIG. 6 showing the bubble radius and microsphere location at the different time intervals after the bubble was initially detected. Time between the consecutive frames is 2 µs.

FIGS. 7a-b shows the bubble radius and the location of the sphere. These were obtained by allocating the desired properties on the image sequence whose first 18 frames are shown in FIG. 6. Reference is now made to FIG. 11, which is the augmented version of FIG. 6 showing the bubble radius and microsphere location at the different time intervals after the bubble was initially detected. Green cross indicates the original location of the sphere that serves as a reference for the later motion of the sphere and the displacement of the bubble as it expands, collapse, and later vanishes. The yellow circle with the respective cross at its center shows the location of the sphere at different time intervals. Finally, the bubble is highlighted with a white circle whose center is indicated by the white cross. It is interesting to note that while the microsphere significantly translates (progresses) during the process, the bubble moves only slightly in the opposite direction.

Statistics of the Bubble Expansion

Variation between individual events makes it hard to facilitate a useful comparison of the results with the Rayleigh-Plesset model for the dynamics of a spherical bubble. These variations come from the explosive nature of the involved phase transition combined with imperfections of the microspheres. Since the setup does not allow to repeatedly excite a given microsphere at the exact same location time after time, the same microsphere was repeatedly excited, and a subset of results was chosen to correspond to the similar EMMET events, where the word "similar" refers to having the laser focused on the exact same location on a given microsphere.

Figure 12:
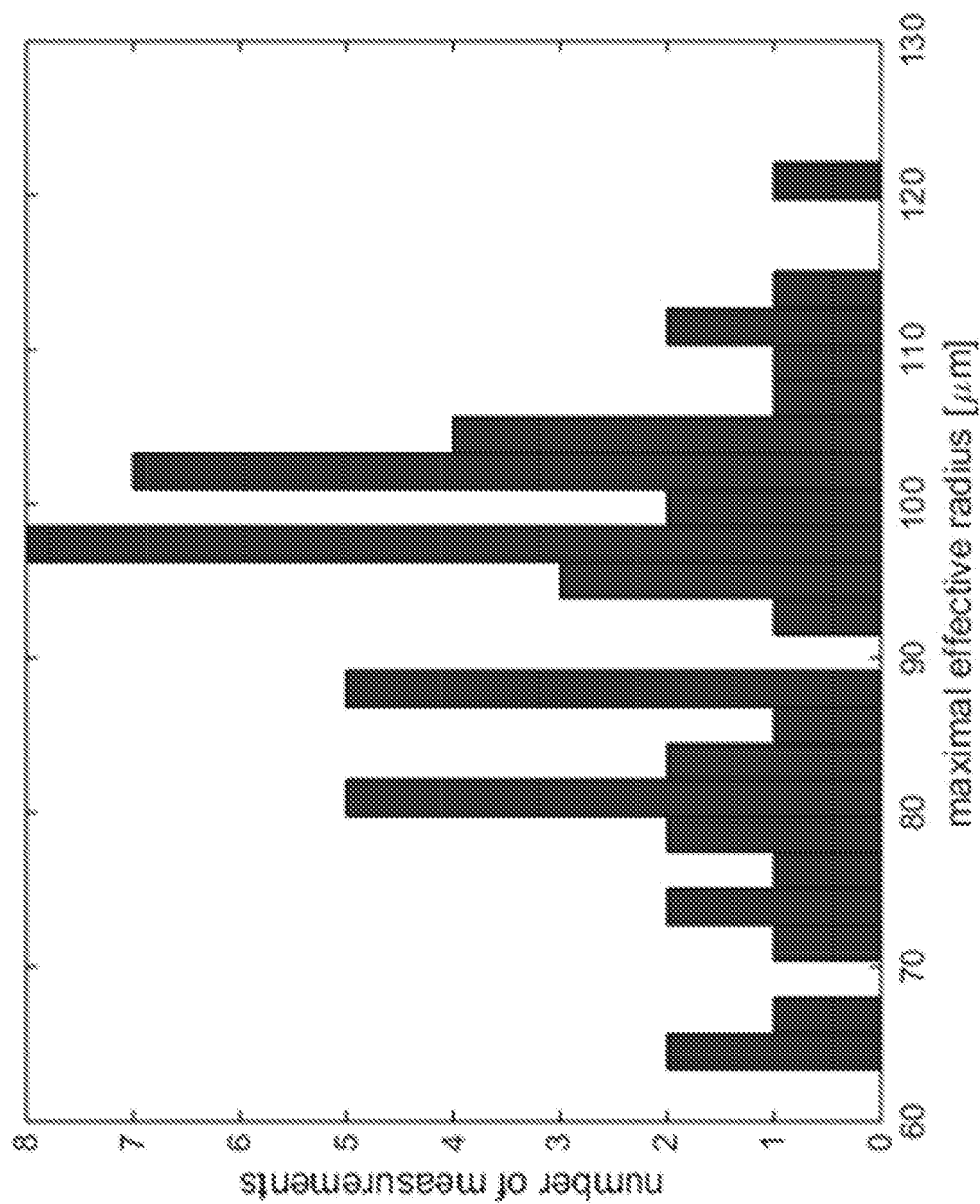
FIG. 12 shows the histogram of the maximal bubble radius for 53 measurements of the same microsphere.

FIG. 12 shows the histogram of the maximal bubble radius for the 53 tests conducted with the same microsphere. The bubble radius seems to approach a normal distribution centered at a bubble radius of 90 to 100 μm. Although no two events were alike, it is possible to assume that focusing the laser on the same location would result in bubbles that closely resemble each other. Therefore, the most probable results are chosen as a representative subset of events for the analysis shown in FIG. 8. These are the 8 bubbles that attained a maximal radius between 96.2 and 98.6 μm. The error bars in FIG. 8 indicates variation within this subset. While the definition of the subset dictates small variation at the maximal bubble radius, the reason for the small variation of the last data point was not expected and its origin remains unclear.

Duration of Heating Period and Simulation of Temperature Distribution

High speed camera was used also to measure the heating time at maximal laser power of 100 mW. The measurements were made capturing a sequence of frames using Ximea MQ003MG-CM camera, while laser was heating the microsphere until the motion took place. The laser was triggered with a mechanical shutter SHB05 from Thorlabs, USA. Images were captured at rates of 1318 and 2398 frame per second. The typical heating time obtained in this case was 3 milliseconds, and it was also confirmed by performing finite element simulation of the temperature of the bead and its surroundings from the laser heating with a COMSOL Multiphysics tool.

Figure 13:
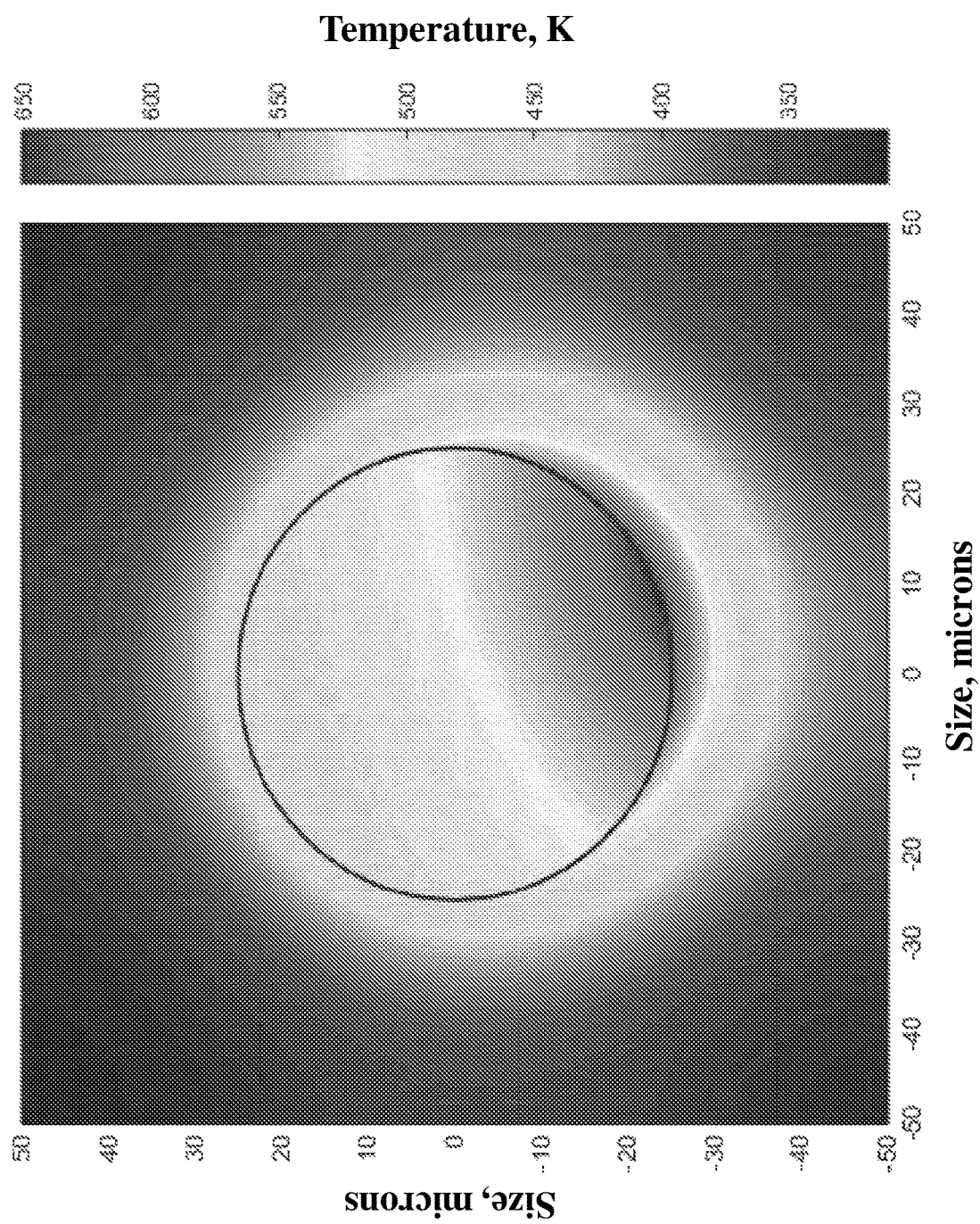
FIG. 13 shows the simulation of the temperature distribution along the cross-section of a 50-mm glass microsphere covered with 200 nm silver after 3 milliseconds heating. Heat is supplied by the optical absorption of an 100 mW light beam with 10 mm waist that is centered 10 mm to the right of the symmetry axis of the sphere.

For the simulation, 40 μm glass sphere covered by 200 nm silver were considered. A 405-nm laser heated the microspheres from the bottom of the reactive reflector with a 100 mW power. The waist of the beam was 20 μm, and the beam was focused 10 nm to the right of the vertical axis of a microsphere. FIG. 13 shows the simulation of the temperature distribution along the cross-section of a 50-mm glass microsphere covered with 200 nm silver and its surroundings after 3 milliseconds heating. Heat is supplied by the optical absorption of an 100 mW light beam with 20 mm waist that is centered 10 mm to the right of the symmetry axis of the sphere. It is notable that the water bulk close to the heat source reached the critical temperature at 650 K, in agreement with the measurement of the heating period described above. Also, simulation shows that the heat is not evenly distributed around the microsphere, by that time. This is in agreement with the observation that the bubble always appears where the laser was heating the microsphere.

Estimating the Equivalent Force

Figure 5:
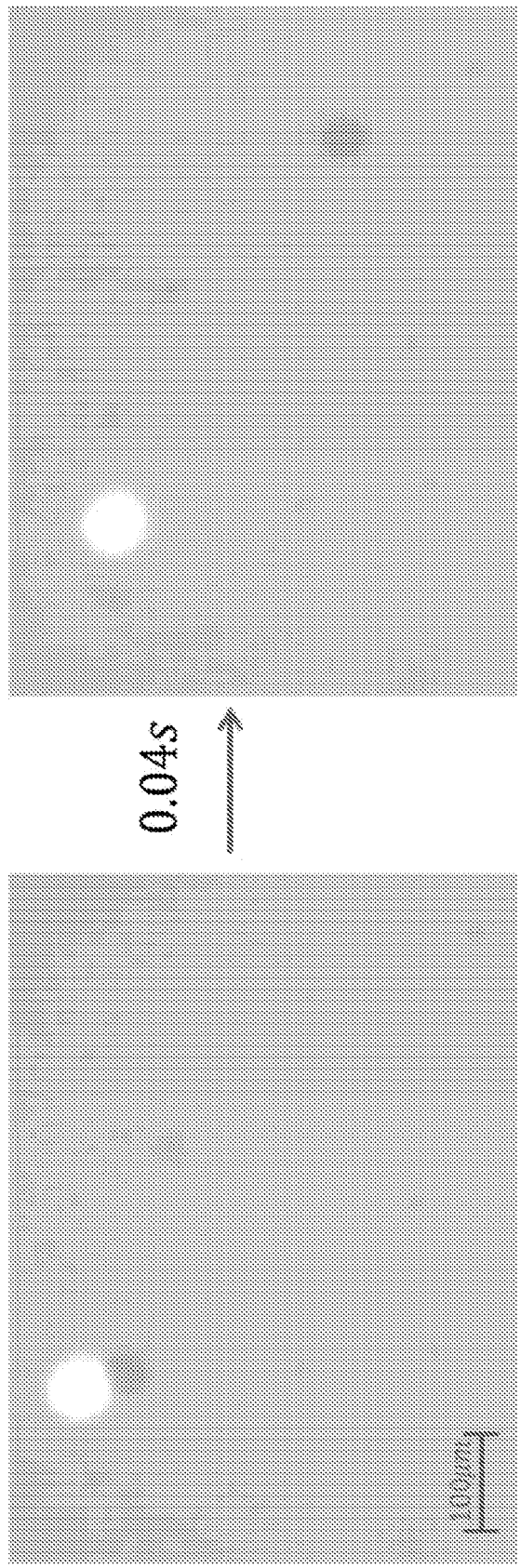
FIGS. 5a-5b show two sequential images out of a rolling video capture of an abrupt jump of a single microsphere upon contact with a light beam.

FIG. 5 shows the EMMET event which was captured with a regular camera at a rate of 25 frames per second. Knowing the distance the microsphere covered and having an upper bound for the duration of that translation, a lower bound on the force is obtained from the equation $m\Delta x/\Delta t^2$, where $\Delta x$ and $\Delta t$ and are the distance and the duration of the motion and $m=(4\pi/3)\rho r^3$ is the mass of the microsphere. Also, the density and radius of the microsphere are given by $\rho$ and $r$, respectively.

In the present case, the microsphere made the distance r=20 nm almost exclusively from glass, so $\rho=2500$ kg/m³. From FIG. 5, the beam translated roughly a distance of 400 μm at time no longer than 0.04 s, and therefore the lower bound of the force in this case is 21 pico-Newtons.

REFERENCES

1. Marston, P. L. James Clerk Maxwell: Life and science. *J. Quant. Spectrosc. Radiat. Transf.* 1, (2015).
2. Lebedev, P. Unttersuchungen uber die Druckkrafte des Lichtes. *Ann. Phys.* 6, 433-458 (1901).

3. Nichols, E. F. & F., H. G. The Pressure Due to Radiation. *Astrophys. J.* XVII, 315-349 (1903).
4. Gordon, P. J. Radiation Forces and Momenta in Dielectric Media. *Phys. Rev. A* 8, 14-21 (1973).
5. Nieminen, T. a et al. Optical tweezers computational toolbox. *J. Opt. A Pure Appl. Opt.* 9, S196-S203 (2007).
6. Ashkin, A. Acceleration and trapping of particels by radiation pressure. *Phys. Rev. Lett.* 24, 156-159 (1970).
7. Phillips, W. D. Nobel Lecture: Laser cooling and trapping of neutral atoms. *Rev. Mod. Phys.* 70, 721-741 (1998).
8. Ashkin, A., Dziedzic, J. M., Bjorkholm, J. E. & Chu, S. Observation of a single-beam gradient force optical trap for dielectric particles. *Opt. Lett.* 11, 288 (1986).
9. Harada, Y. & Asakura, T. Radiation forces on a dielectric sphere in the Rayleigh scattering regime. *Opt. Commun.* 124, 529-541 (1996).
10. Nieminen, T. a., Rubinsztein-Dunlop, H., Heckenberg, N. R. & Bishop, a. I. Numerical modelling of optical trapping. *Comput. Phys. Commun.* 142, 468-471 (2001).
11. Svoboda, K. & Block, S. M. Optical trapping of metallic Rayleigh particles. *Opt. Lett.* 19, 930-932 (1994).
12. Brzobohatý, O. et al. Non-spherical gold nanoparticles trapped in optical tweezers: shape matters. *Opt. Express* 23, 8179 (2015).
13. Mansuripur, M. Radiation pressure and the linear momentum of light in dispersive dielectric media. *Opt. Express* 13, 2245-2250 (2005).
14. Moffitt, J., Chemla, Y., Smith, S. & Bustamante, C. Recent advances in optical tweezers. *Annu. Rev. Biochem.* 77, 205-228 (2008).
15. Mansuripur, M. Radiation pressure and the linear momentum of the electromagnetic field. *Opt. Express* 12, 5375 (2004).
16. Neuman, K. C. & Block, S. M. Optical trapping. *Rev. Sci. Instrum.* 75, 2787-2809 (2004).
17. Miljković, V. D., Pakizeh, T., Sepulveda, B., Johansson, P. & Käll, M. Optical forces in plasmonic nanoparticle dimers. *J. Phys. Chem. C* 114, 7472-7479 (2010).
18. Jiang, H. R., Yoshinaga, N. & Sano, M. Active motion of a Janus particle by self-thermophoresis in a defocused laser beam. *Phys. Rev. Lett.* 105, 1-4 (2010).
19. Ilic, O., Kaminer, I., Lahini, Y., Buljan, H. & Soljačić, M. Exploiting Optical Asymmetry for Controlled Guiding of Particles with Light. *ACS Photonics* 3, 197-202 (2016).
20. Nedev, S. et al. An optically controlled microscale elevator using plasmonic janus particles. *ACS Photonics* 2, 491-496 (2015).
21. Lohse, D. Bubble puzzles. *Phys. Today* 56, 36-41 (2003).
22. Zou, A., Chanana, A., Agrawal, A., Wayner, P. C. & Maroc), S. C. Steady State
Vapor Bubble in Pool Boiling. *Sci. Rep.* 6, 20240 (2016).
23. van Hoeve, W., Dollet, B., Versluis, M. & Lohse, D. Microbubble formation and pinch-off scaling exponent in flow-focusing devices. *Phys. Fluids* 23, (2011).
24. Plesset, M. S. & Zwick, S. A. The growth of vapor bubbles in superheated liquids. *J. Appl. Phys.* 25, 493-500 (1954).
25. Prosperitti, A. Prosperetti 1994—Bubble Dynamics—Some things we did not know 10 years ago.pdf. *Bubble Dynamics and interface phenomena* (1993).
26. Akhatov, I. et al. Collapse and rebound of a laser-induced cavitation bubble. *Phys. Fluids* 13, 2805-2819 (2001).
27. Office, N., Of, T. H. E. G. & Bubble, V. Approved by: M. S. Plesset. (1954).
28. Brennen, C. E. *Cavitation and bubble dynamics*. (2010). doi:10.1017/CBO9781107338760
29. Prosperetti, A. Bubbles. *Phys. Fluids* 16, 1852-1865 (2004).
30. Ciccarelli, G. & Frost, D. L. Fragmentation mechanisms based on single drop steam explosion experiments using flash X-ray radiography. *Nucl. Eng. Des.* 146, 109-132 (1994).

The invention claimed is:

1. A non-tracking solar energy collector comprising:
   (a) at least one solar radiation concentrator configured to collimate and direct the incident solar radiation rays to at least one focal point along the surface of a reactive reflector;
   (b) the reactive reflector mounted on top of an external cavity and configured to let solar radiation rays to enter said external cavity, said reactive reflector having at least one transparency zone instantly formed at said at least one focal point of the solar radiation rays beyond intensity threshold, and said at least one transparency zone constantly moving along the surface of said reactive reflector following the position of said at least one focal point of the solar radiation rays; and
   (c) the external cavity containing a solar cell and configured to trap the entered solar radiation rays by inner scattering of said solar radiation rays on the walls of said external cavity,
   wherein said inner scattering of said solar radiation rays inside said external cavity is capable of preventing solar radiation to dissipate from said solar cell, thereby minimising solar radiation losses, wherein said reactive reflector comprises:
   (a) a separator film or spacer sheet having an opening filled with a suspension of highly reflective microparticles in a liquid, and
   (b) two optically transparent slides, the first optically transparent slide being attached at the bottom of said separator film forming a solid support for said reactive reflector, and the second optically transparent slide being attached at the top of said separator film covering said opening, wherein said separator film is squeezed between two said optically transparent slides, thereby forming a sandwich-like structure.

2. The non-tracking solar energy collector of claim 1, wherein said external cavity contains more than one spectrally optimised solar cell.

3. The non-tracking solar energy collector of claim 2, wherein said external cavity contains more than one band transmission filters attached to said spectrally optimised solar cells, said band transmission filters having different transmission wavelengths.

4. The non-tracking solar energy collector of claim 1, wherein said solar radiation concentrator is a reflector or an array thereof, or a lens or an array thereof.

5. The non-tracking solar energy collector of claim 1, wherein said highly reflective microparticles are metal-coated glass microspheres.

6. The non-tracking solar energy collector of claim 5, wherein said metal-coated glass microspheres are silver-coated or aluminium-coated glass microspheres.

7. The non-tracking solar energy collector of claim 5, wherein said metal-coated glass microspheres have a mean diameter in the range of about 1-100 μm.

8. The non-tracking solar energy collector of claim 7, wherein said metal-coated glass microspheres have a mean diameter in the range of about 42-62 μm.

9. The non-tracking solar energy collector of claim 1, wherein said liquid is water.

10. The non-tracking solar energy collector of claim 1, wherein said separator film has a thickness of about 100 μm.

11. The non-tracking solar energy collector of claim 1, wherein said opening in said separator film has a diameter of about 5 mm that determines the effective aperture of said non-tracking solar energy collector.

12. The non-tracking solar energy collector of claim 1, wherein two said optically transparent slides are commercially available microscope slides.

13. A method for manufacturing the reactive reflector of claim 1 comprising the following steps:
  (i) Placing the separator film on the first optically transparent slide forming a solid support for said reactive reflector;
  (ii) Preparing a diluted liquid suspension of highly reflective microparticles;
  (iii) Filling the opening in said separator film with said diluted liquid suspension of the highly reflective microparticles to form a uniform thin layer of said highly reflective microparticles; and
  (iv) Placing the second optically transparent slide on top of said separator film, thereby covering said opening and encapsulating said highly reflective microparticles.

\* \* \* \* \*